US011828344B2

(12) United States Patent
Van De Wijdeven et al.

(10) Patent No.: US 11,828,344 B2
(45) Date of Patent: Nov. 28, 2023

(54) SUPPORT, VIBRATION ISOLATION SYSTEM, LITHOGRAPHIC APPARATUS, OBJECT MEASUREMENT APPARATUS, DEVICE MANUFACTURING METHOD

(71) Applicant: ASML Netherlands B.V., Veldhoven (NL)

(72) Inventors: Jeroen Johan Maarten Van De Wijdeven, Eindhoven (NL); Johannes Petrus Martinus Bernardus Vermeulen, Leende (NL); Jeroen Pieter Starreveld, Knegsel (NL); Stan Henricus Van Der Meulen, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/633,000

(22) PCT Filed: Jul. 9, 2020

(86) PCT No.: PCT/EP2020/069346
§ 371 (c)(1),
(2) Date: Feb. 4, 2022

(87) PCT Pub. No.: WO2021/023464
PCT Pub. Date: Feb. 11, 2021

(65) Prior Publication Data
US 2022/0290734 A1 Sep. 15, 2022

(30) Foreign Application Priority Data

Aug. 5, 2019 (EP) ..................................... 19190011
Dec. 16, 2019 (EP) ..................................... 19216580

(51) Int. Cl.
F16F 15/02 (2006.01)
G03F 7/00 (2006.01)
F16F 13/00 (2006.01)

(52) U.S. Cl.
CPC .......... *F16F 15/022* (2013.01); *F16F 13/005* (2013.01); *G03F 7/709* (2013.01); *G03F 7/70833* (2013.01); *F16F 2222/08* (2013.01)

(58) Field of Classification Search
CPC .... F16F 15/022; F16F 13/005; F16F 2222/08; G03F 7/70833; G03F 7/709
See application file for complete search history.

(56) References Cited

U.S. PATENT DOCUMENTS 6,020,964 A 2/2000 Loopstra et al.
6,236,145 B1 5/2001 Biernacki
(Continued)

FOREIGN PATENT DOCUMENTS

DE 102011089863 A1 6/2013
EP 0093669 A1 11/1983
(Continued)

OTHER PUBLICATIONS

International Search Report and Written Opinion of the International Searching Authority directed to related International Patent Application No. PCT/EP2020/069346, dated Nov. 23, 2020; 9 pages.

(Continued)

*Primary Examiner* — Hung V Nguyen
(74) *Attorney, Agent, or Firm* — Sterne, Kessler, Goldstein & Fox P.L.L.C.

(57) ABSTRACT

The invention provides a support with first and second end portions. The second end portion is on the side opposite to the first end portion in a longitudinal direction of the support. A coil spring is arranged between the first and
(Continued)

second end portions. The coil spring comprises a first spiral member that extends between the first and second end portions in a circumferential direction of the support, and a second spiral member that extends between the first and second end portions in a circumferential direction of the support. The first and second spiral members extend in the longitudinal direction around a longitudinal axis of the support, wherein the first spiral member of the coil spring and the second spiral member of the coil spring are moveable relative to each other, and wherein the support further comprises a damper device that is attached to the first spiral member.

20 Claims, 12 Drawing Sheets

(56) References Cited

U.S. PATENT DOCUMENTS

| | | | |
|---|---|---|---|
| 6,952,253 | B2 | 10/2005 | Lof et al. |
| 9,696,630 | B2 * | 7/2017 | Van Der Wijst .... G03F 7/70258 |
| 2007/0058173 | A1 | 3/2007 | Holzapfel |
| 2018/0209504 | A1 | 7/2018 | Kim et al. |
| 2019/0324375 | A1 | 10/2019 | Peijster |

FOREIGN PATENT DOCUMENTS

| | | |
|---|---|---|
| EP | 0552811 A1 | 7/1993 |
| EP | 0574650 A1 | 12/1993 |
| EP | 1081407 A1 | 3/2001 |
| EP | 2469340 A2 | 6/2012 |
| EP | 2469340 A3 | 5/2015 |
| JP | S36-027714 Y | 10/1960 |
| JP | S59-163246 A | 9/1984 |
| JP | S62-209239 A | 9/1987 |
| JP | 2002-227898 A | 8/2002 |
| JP | 2002-227922 A | 8/2002 |
| JP | 2005-207589 A | 8/2005 |
| JP | 2007-333128 A | 12/2007 |
| JP | 2012-134486 A | 7/2012 |
| JP | 2018-524533 A | 8/2018 |
| TW | 201833685 A | 9/2018 |
| WO | WO 2018/192759 A1 | 10/2018 |

OTHER PUBLICATIONS

International Preliminary Report on Patentability directed to related International Patent Application No. PCT/EP2020/069346, dated Feb. 8, 2022; 6 pages.

* cited by examiner

SUPPORT, VIBRATION ISOLATION SYSTEM, LITHOGRAPHIC APPARATUS, OBJECT MEASUREMENT APPARATUS, DEVICE MANUFACTURING METHOD

CROSS-REFERENCE TO RELATED APPLICATION

The application claims priority of EP application 19190011.7 which was filed on Aug. 5, 2019 and EP application 19216580.1 which was filed on Dec. 16, 2019, and which are incorporated herein in its entirety by reference.

FIELD

The present invention relates to a system, a support, a vibration isolation system, a lithographic apparatus, an object measurement apparatus, and a device manufacturing method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). An object measurement apparatus is for example suitable for measuring and/or inspecting a pattern which has been applied to an object e.g. to a substrate, e.g. to a wafer, and/or for inspecting a mask.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In lithographic processes, it is of the utmost importance that the pattern that is projected on the substrate is highly accurate. The positioning of the substrate relative to the projection system plays an important role in achieving the desired accuracy of the pattern. The positions of parts of the lithographic system such as the stage and the projection system and its internal components have to be accurately measured and/or controlled.

The requirements for the accuracy of the projected patterns and the desired throughput of the lithographic apparatuses are constantly increasing. The increase of the throughput may have a negative impact on the dynamic behaviour of some components of the lithographic system, while on the other hand the requirements with respect to the dynamic properties become more stringent because of the desired increase in accuracy.

Several components of which the dynamic behaviour is relevant for obtaining the desired increase accuracy and throughput are supported by mechanical supports, which may or may not be part of a vibration isolation system.

In known lithographic apparatus, an intermediate mass is added to a coil spring in the support in order to change the dynamic properties of the support. However, this approach increases the mass and/or the stiffness of the support, which is undesirable in the context of the design of the lithographic apparatus.

SUMMARY

In an embodiment, it is aimed to provide a support which has improved dynamic properties.

According to an embodiment of the invention, a support is provided which comprises:
  a first end portion and a second end portion wherein the second end portion is on the side opposite to the first end portion in a longitudinal direction of the support,
  a coil spring which is arranged between the first end portion and the second end portion, which coil spring comprises:
    a first spiral member which extends between the first end portion and the second end portion in a circumferential direction of the support, and
    a second spiral member which extends between the first end portion and the second end portion in a circumferential direction of the support,
  the first spiral member and the second spiral member extending in the longitudinal direction around a longitudinal axis of the support,
  wherein the first spiral member of the coil spring and the second spiral member of the coil spring are moveable relative to each other,
    wherein the support further comprises a damper device which is attached to the first spiral member.

In accordance with this embodiment, the support comprises a first end portion and a second end portion, and a coil spring which extends between the first end portion and the second end portion. The first end portion for example has a body engagement face which is adapted to engage a body to be supported. The a second end portion for example has a bearing surface engagement face which is adapted to engage a load bearing surface onto which the body is to be supported.

The coil spring comprises a first spiral member and a second spiral member. Optionally, a different number of spiral members is present, for example three, four, five or six spiral members. Optionally, the longitudinal axis of the first spiral member coincides with the longitudinal axis of the second spiral member.

The first spiral member and the second spiral member of the coil spring are moveable relative to each other. It has been observed that at relatively high frequencies, e.g. frequencies above 1 kHz, e.g. between 1400 Hz and 1600 Hz, at a certain vibration frequency the first spiral member may have a different vibration mode shape than the second spiral member.

In accordance with this embodiment of the invention, a damper device is attached to the first spiral member. This damper device reduces the displacement of the first spiral member at at least one location between two adjacent nodes of a vibration mode shape of the first spiral member, e.g. in a vibration mode shape which is present in the first spiral member at a frequency which is 1 kHz or higher.

Therewith, the dynamic behaviour of the support is improved, optionally without introducing a significant additional mass and/or a significant additional stiffness.

In an embodiment of the support according to the invention, the damper device is configured to dampen movement of the first spiral member relative to at least one of the first end portion, the second end portion and/or the second spiral member.

In this embodiment, the local displacement of at least one part of the first spiral member relative to the first end portion and/or to the second end portion and/or to the second spiral member is reduced.

In an embodiment of the support according to the invention, the first spiral member of the coil spring and the second spiral member of the coil spring are moveable relative to each other in the longitudinal direction of the support.

This embodiment allows for a practical implementation of the invention.

In an embodiment of the support according to the invention, the first spiral member has a vibration mode shape associated with a vibration frequency, which vibration mode shape comprises an anti-node, and wherein the second spiral member has a vibration mode shape associated with said vibration frequency which vibration mode shape of the second spiral member comprises a node.

The damper can in some embodiments be most effective when it is connected to the first spiral member at the position of an anti-node of the vibration mode shape for which damping is desired. At the location of an anti-node, the displacement is larger than at other locations of the spiral member.

In an embodiment of the support according to the invention, the coil spring comprises at least one free spiral member which is not in engagement with the damper device. The free spiral member is the second spiral member and/or a further spiral member other than the first or the second spiral member.

The presence of a free spiral member helps to prevent that the static stiffness of the support is increased too much by the application of the damper device.

In an embodiment of the support according to the invention, the damper device comprises a first damper body comprising a material having vibration dampening properties, wherein said first damper body optionally has a first connector surface which is connected to the first spiral member.

Optionally, the first damper body is made of a material having vibration dampening properties.

The first connector surface may be connected to the first spiral member either directly or indirectly.

Optionally, the material having vibration dampening properties is a visco-elastic material.

Optionally, the first damper body further comprises a second connector surface which is connected to the second spiral member. The second connector surface may be connected to the second spiral member either directly or indirectly.

Optionally, the first spiral member has a vibration mode shape (which vibration mode shape is associated with a vibration frequency) which comprises an anti-node, and the second spiral member has a vibration mode shape (which vibration mode shape is associated with the same vibration frequency) which comprises a node, and the first connector surface is attached to the first spiral member at the position of the anti-node and the second connector surface is attached to the second spiral member at the position of the node.

In an embodiment of the support according to the invention, the damper device comprises:
a first damper body comprising a material having vibration dampening properties, wherein said first damper body optionally has a first connector surface which is connected to the first spiral member, and
a second damper body comprising a material having vibration dampening properties, wherein said second damper body optionally has a first connector surface which is connected to the second spiral member.

Optionally, the first damper body is made of a material having vibration dampening properties. Optionally, the second damper body is made of a material having vibration dampening properties.

The first connector surface of the first damper body may be connected to the first spiral member either directly or indirectly. The first connector surface of the second damper body may be connected to the second spiral member either directly or indirectly.

Optionally, the material having vibration dampening properties is a visco-elastic material.

Optionally, the damper device further comprises a constrainer body, the first damper body comprises a second connector surface which is connected to the constrainer body, and the second damper body comprises a second connector surface which is connected to the constrainer body.

The second connector surface of the first damper body may be connected to the constrainer body either directly or indirectly. The second connector surface of the second damper body may be connected to the constrainer body either directly or indirectly.

In an embodiment of the support according to the invention, the damper device comprises a tuned mass damper which is connected to the first spiral member.

The tuned mass damper may be connected to the first spiral member either directly or indirectly.

Optionally, the tuned mass damper comprises a damper body which has a damper body mass. The damper body mass may for example be less than 50 grams, preferably less than 20 grams, optionally between 2 and 15 grams.

According to an embodiment of the invention, a vibration isolation system is provided which comprises a first support, which first support is a support in accordance with any of the embodiments as discussed above.

Optionally, the vibration isolation system is an active vibration isolation system. An active vibration system may for example comprise at least one support which is a support in accordance with any of the embodiments described above and an actuator. The actuator is for example configured to induce displacement of a body which is connected to the vibration isolation system.

Optionally, the vibration isolation system further comprises a second support, which second support is a support in accordance with any of the embodiments described above. The first support and the second support are for example arranged in series with each other or parallel to each other.

According to an embodiment of the invention, a lithographic apparatus is provided which comprises a first support, which first support is a support in accordance with any of the embodiments as discussed above.

According to an embodiment of the invention, a lithographic apparatus is provided which comprises a first frame, a second frame and a vibration isolation system. The vibration isolation system is arranged between the first frame and the second frame. The vibration isolation system is a vibration isolation system in accordance with any of the embodiments described above.

For example, the first frame is a sensor frame and wherein the second frame is a force frame.

According to an embodiment of the invention, an object measurement apparatus is provided which comprises a first support, which first support is a support in accordance with any of the embodiments as discussed above.

For example, the object measurement apparatus is or comprises an object inspection apparatus, e.g. an object inspection apparatus which is configured to inspect a substrate, e.g. a semiconductor substrate such as a wafer.

According to an embodiment of the invention, a device manufacturing method is provided which comprises transferring a pattern from a patterning device onto a substrate, comprising the step of using a lithographic apparatus in accordance with any of the embodiments described above.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array and a programmable LCD array.

Figure 1:
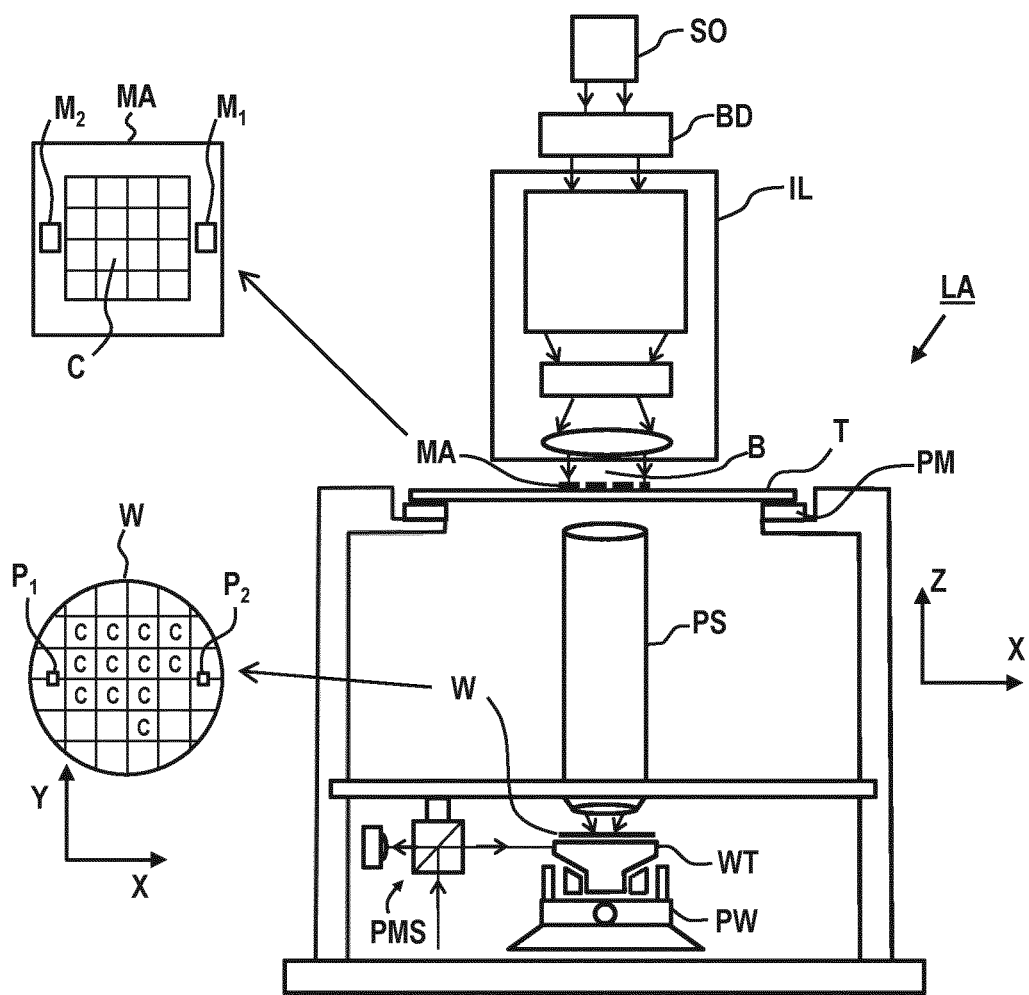
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
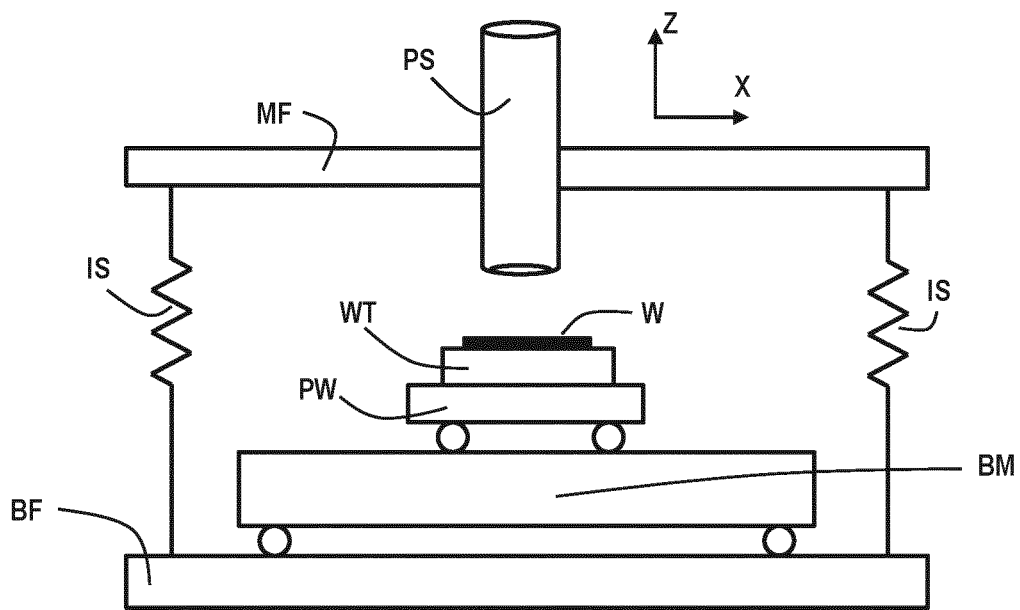
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
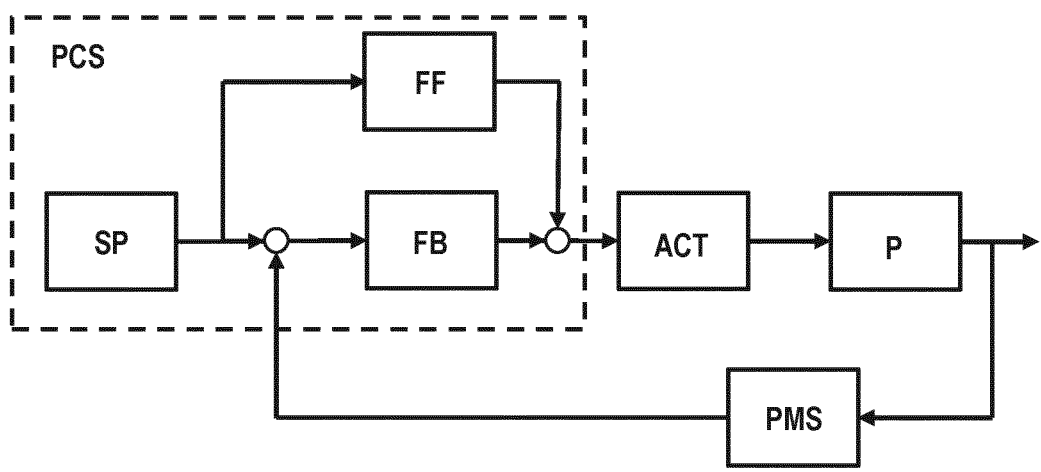
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4A:
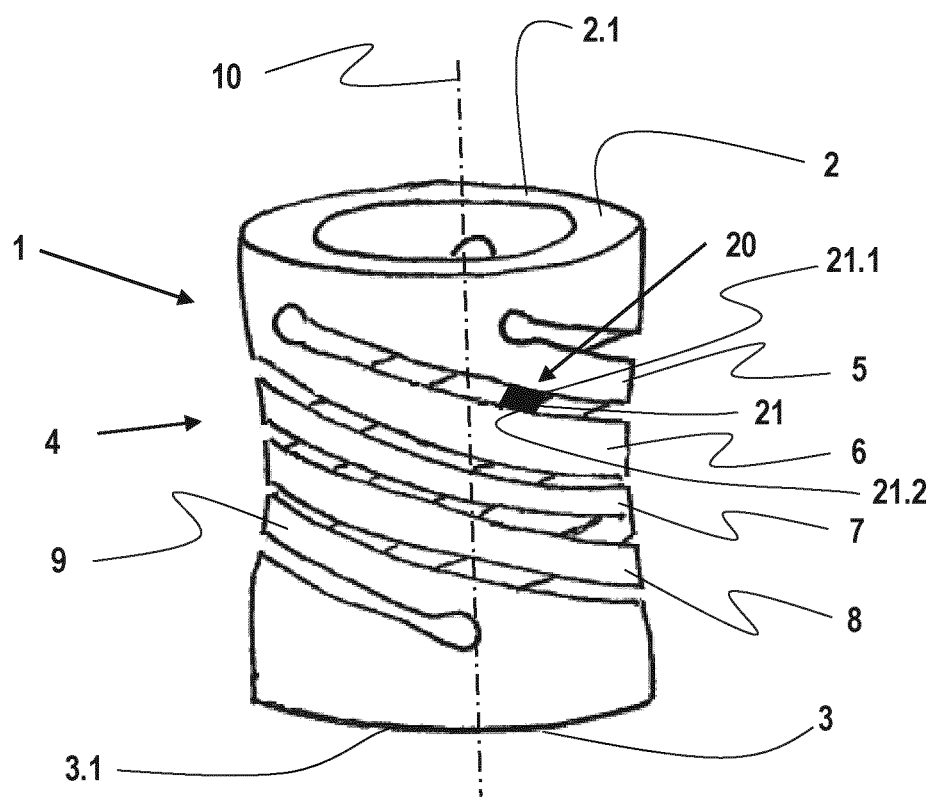
FIG. 4A schematically shows a first embodiment of a support according to the invention, FIG. 4B schematically shows a variant of the embodiment of FIG. 4A, in cross section, FIG. 5A schematically shows a further variant of the embodiment of FIG. 4B, in cross section.

FIG. 4A schematically shows a first embodiment of a support 1 according to the invention.

The support 1 comprises a first end portion 2 and a second end portion 3. The second end portion 3 is on the side opposite to the first end portion 2 in a longitudinal direction of the support. The first end portion 2 has a body engagement face 2.1 which is adapted to engage a body to be supported. The second end portion 3 has a bearing surface engagement face 3.1 which is adapted to engage a load bearing surface onto which the body is to be supported.

The support further comprises a coil spring 4. The coil spring 4 is arranged between the first end portion 2 and the second end portion 3. In the embodiment of FIG. 4A, the coil spring comprises multiple spiral members 5, 6, 7, 8, 9. These spiral members include a first spiral member 5 and a second spiral member 6. All spiral members extend between the first end portion 2 and the second end 3 portion in a circumferential direction of the support 1. Each spiral member 5, 6, 7, 8, 9 has a helical shape which extends between the first end portion 2 and the second end portion 3. Each individual spiral member 5, 6, 7, 8, 9 has its own first end which engages the first end portion 2 of the support 1 and its own opposite second end which engages the second end portion 3 of the support 1. The spiral members 5, 6, 7, 8, 9 are moveable relative to each other, for example in the longitudinal direction of the support 1. In particular, the first spiral member 5 of the coil spring 4 and the second spiral member 6 of the coil spring 4 are moveable relative to each other, e.g. in the longitudinal direction of the support 1. In the embodiment of FIG. 4A, the longitudinal axes of all spiral members 5, 6, 7, 8, 9 coincide with each other. In the unloaded situation of the support, adjacent spiral members 5, 6, 7, 8, 9 are substantially parallel to each other.

In the embodiment of FIG. 4A, the spiral members have a square cross section. However, alternatively or in addition, other cross sectional shapes are possible as well, such as circular, elliptical, rectangular, and or trapezoid.

The dimensions of the cross section of a spiral member may be constant or may vary over the length of the spiral member (i.e. along the helical direction in which the spiral member extends around the longitudinal axis 10 of the support).

The cross sectional dimensions optionally are the same for all spiral members. Alternatively, different spiral members have different cross sectional dimensions.

In the example of FIG. 4A, the outer diameter of the coil spring 4 varies over the length of the coil spring 4. Alternatively, the outer diameter may be constant over the length of the coil spring. In the example of FIG. 4A, the inner diameter of the coil spring 4 is constant over the length of the coil spring 4. Alternatively, the inner diameter may vary over the length of the coil spring.

It has been observed at relatively high frequencies, e.g. frequencies above 1 kHz, e.g. between 1400 Hz and 1600 Hz, the spiral members 5, 6, 7, 8, 9 may have mutually different vibration mode shapes associated with the same vibration frequency. For example, at the same vibration frequency, the first spiral member 5 may have a different vibration mode shape than the second spiral member 6.

In accordance with the embodiment of FIG. 4A, a damper device 20 is attached to the first spiral member 5. This damper device 20 reduces the displacement of the first spiral member 5 at at least one location between two adjacent nodes of a vibration mode shape of the first spiral member 5, e.g. in a vibration mode shape which is present in the first spiral member 5 at a frequency which is 1 kHz or higher. The damper device 20 is configured to dampen movement of the first spiral member 5 relative to at least one of the first end portion 2, the second end portion 3 and/or the second spiral member 6.

In the embodiment of FIG. 4A, the damper device 20 comprises a first damper body 21. The damper body 21 comprises a material having vibration dampening properties, e.g. a visco-elastic material. Optionally, the first damper body 21 is made of a material having vibration dampening properties, e.g. a visco-elastic material.

In the embodiment of FIG. 4A, the first damper body 21 is arranged between the first spiral member 5 and the second spiral member 6. The first damper body 21 has a first connector surface 21.1 which is connected to the first spiral member 5 and a second connector surface 21.2 which is connected to the second spiral member 6.

The damper body 21 connects the first spiral member 5 and the second spiral member 6 with each other. Because of the damping properties of the material of the damper body, the displacement of the first spiral member 5 relative to at least one of the first end portion 2, the second end portion 3 and/or the second spiral member 6 due to a high frequency vibration mode shape (e.g. a vibration mode shape at a frequency above 1 kHz, e.g. at a frequency between 1400 Hz and 1600 Hz) is reduced.

In order to optimize the damping, the vibration mode shapes of the first spiral member 5 and the second spiral member 6 have to be considered at a certain vibration frequency, e.g. on the basis of an experimental and/or numerical modal analysis of the support, the coil spring and/or the spiral members. Based on the outcome of such a modal analysis, the optimal position of the damper body 21 can be determined.

For example, at a certain frequency, the first spiral member 5 has a vibration mode shape which comprises an anti-node, and the second spiral member 6 has a vibration mode shape which comprises a node. The first connector surface 21.1 of the damper body 21 may be attached to the first spiral member 5 at the position of the anti-node and the second connector surface 21.2 of the damper body 21 may be attached to the second spiral member 6 at the position of the node. This way, the node of the second spiral member 6 inhibits the movement of the anti-node of the first spiral member 5. This way, the local displacement of the first spiral member 5 of a location between two adjacent nodes is reduced.

Alternatively or in addition, for example the first spiral member 5 has a vibration mode shape which comprises an anti-node, and the second spiral member 6 has a vibration mode shape which also comprises an anti-node, and the anti-nodes move out-of-phase which each other. So, when the anti-node of the first spiral member 5 moves towards the first end 2 of the support 1, the anti-node of the second spiral member 6 moves towards the second end 3 of the support 1, and vice versa. The first connector surface 21.1 of the damper body 21 may be attached to the first spiral member 5 at the position of the anti-node of the first spiral member 5 and the second connector surface 21.2 of the damper body 21 may be attached to the second spiral member 6 at the position of the anti-node of the second spiral member 6. This way, the anti-nodes inhibit each other's movement. This way, the local displacement of the first spiral member 5 of a location between two adjacent nodes is reduced.

In the embodiment of FIG. 4A, the coil spring comprises at least one free spiral member which is not in engagement with the damper device 20. In this embodiment, the free spiral members are the third spiral member 7, the fourth spiral member 8 and the fifth spiral member 9.

In the embodiment of FIG. 4A, the damper body 21 will be mainly subjected to tension and/or pressure.

The support 1 as shown in FIG. 4A can for example be manufactured by machining a tubular starting material, e.g. a steel tube (e.g. a stainless steel tube), an aluminum tube or a plastic tube and subsequently attaching the damper body 21 at the desired position. The damper body 21 can for example be attached by gluing or by pre-tension.

Figure 4B:
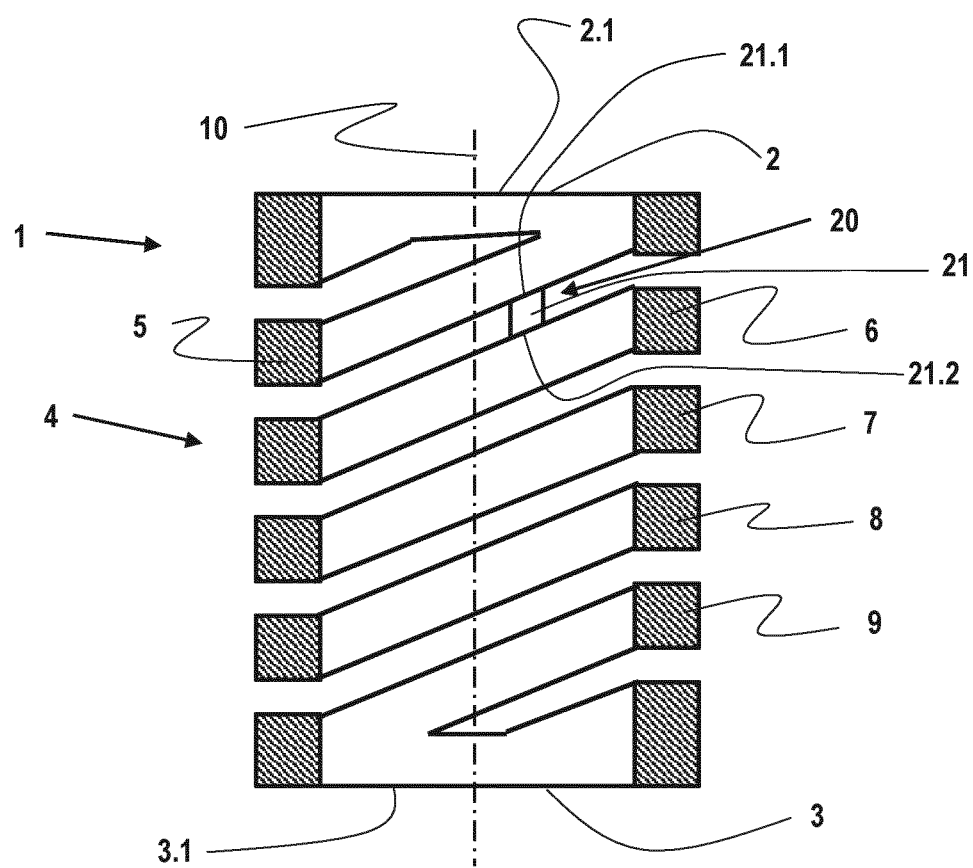

FIG. 4B schematically shows a variant of the embodiment of FIG. 4A, in cross section. A difference between the embodiment of FIG. 4A and the variant of FIG. 4B is that in the embodiment of FIG. 4A, the outer diameter of the coil spring 4 varies while in the variant of FIG. 4B, the outer diameter of the coil spring 4 is constant. Otherwise, the embodiment of FIG. 4A and the variant of FIG. 4B are identical with respect to the main features.

The support 1 comprises a first end portion 2 and a second end portion 3. The second end portion 3 is on the side opposite to the first end portion 2 in a longitudinal direction of the support. The first end portion 2 has a body engagement face 2.1 which is adapted to engage a body to be supported. The second end portion 3 has a bearing surface engagement face 3.1 which is adapted to engage a load bearing surface onto which the body is to be supported.

The support further comprises a coil spring 4. The coil spring 4 is arranged between the first end portion 2 and the second end portion 3. In the embodiment of FIG. 4B, the coil spring 4 comprises multiple spiral members 5, 6, 7, 8, 9. These spiral members include a first spiral member 5 and a second spiral member 6. All spiral members extend between the first end portion 2 and the second end 3 portion in a circumferential direction of the support 1. Each spiral member 5, 6, 7, 8, 9 has a helical shape which extends between the first end portion 2 and the second end portion 3. Each individual spiral member 5, 6, 7, 8, 9 has its own first end which engages the first end portion 2 of the support 1 and its own opposite second end which engages the second end portion 3 of the support 1. The spiral members 5, 6, 7, 8, 9 are moveable relative to each other, for example in the longitudinal direction of the support 1. In particular, the first spiral member 5 of the coil spring 4 and the second spiral member 6 of the coil spring 4 are moveable relative to each other, e.g. in the longitudinal direction of the support 1. In the embodiment of FIG. 4B, the longitudinal axes of all spiral members 5, 6, 7, 8, 9 coincide with each other. In the unloaded situation of the support, adjacent spiral members 5, 6, 7, 8, 9 are substantially parallel to each other.

In the embodiment of FIG. 4B, the spiral members have a square cross section. However, alternatively or in addition, other cross sectional shapes are possible as well, such as circular, elliptical, rectangular, and or trapezoid.

The dimensions of the cross section of a spiral member may be constant or may vary over the length of the spiral member (i.e. along the helical direction in which the spiral member extends around the longitudinal axis 10 of the support).

The cross sectional dimensions optionally are the same for all spiral members. Alternatively, different spiral members have different cross sectional dimensions.

It has been observed at relatively high frequencies, e.g. frequencies above 1 kHz, e.g. between 1400 Hz and 1600 Hz, the spiral members 5, 6, 7, 8, 9 may have mutually different vibration mode shapes associated with the same vibration frequency. For example, at this vibration frequency, the first spiral member 5 may have a different mode shape than the second spiral member 6.

In accordance with the embodiment of FIG. 4B, a damper device 20 is attached to the first spiral member 5. This damper device 20 reduces the displacement of the first spiral member 5 at at least one location between two adjacent nodes of a vibration mode shape of the first spiral member 5, e.g. in a vibration mode shape which is present in the first spiral member 5 at a frequency which is 1 kHz or higher. The damper device 20 is configured to dampen movement of the first spiral member 5 relative to at least one of the first end portion 2, the second end portion 3 and/or the second spiral member 6.

In the embodiment of FIG. 4B, the damper device 20 comprises a first damper body 21. The damper body 21 comprises a material having vibration dampening properties, e.g. a visco-elastic material. Optionally, the first damper body 21 is made of a material having vibration dampening properties, e.g. a visco-elastic material.

In the embodiment of FIG. 4B, the first damper body 21 is arranged between the first spiral member 5 and the second spiral member 6. The first damper body 21 has a first connector surface 21.1 which is connected to the first spiral member 5 and a second connector surface 21.2 which is connected to the second spiral member 6.

The damper body 21 connects the first spiral member 5 and the second spiral member 6 with each other. Because of the damping properties of the material of the damper body, the displacement of the first spiral member 5 relative to at least one of the first end portion 2, the second end portion 3 and/or the second spiral member 6 due to a high frequency vibration mode shape (e.g. a vibration mode shape at a frequency above 1 kHz, e.g. at a frequency between 1400 Hz and 1600 Hz) is reduced.

In order to optimize the damping, the vibration mode shapes of the first spiral member 5 and the second spiral member 6 have to be considered at a certain vibration frequency, e.g. on the basis of an experimental and/or numerical modal analysis of the support, the coil spring and/or the spiral members. Based on the outcome of such a modal analysis, the optimal position of the damper body 21 can be determined.

For example, at a certain frequency, the first spiral member 5 has a vibration mode shape which comprises an anti-node, and the second spiral member 6 has a vibration mode shape which comprises a node. The first connector surface 21.1 of the damper body 21 may be attached to the first spiral member 5 at the position of the anti-node and the second connector surface 21.2 of the damper body 21.2 may be attached to the second spiral member 6 at the position of the node. This way, the node of the second spiral member 6 inhibits the movement of the anti-node of the first spiral member 5. This way, the local displacement of the first spiral member 5 of a location between two adjacent nodes is reduced.

Alternatively or in addition, for example, at a certain vibration frequency, the first spiral member 5 has a vibration mode shape which comprises an anti-node, and the second spiral member 6 has a vibration mode shape which also comprises an anti-node, and the anti-nodes move out-of-phase which each other. So, when the anti-node of the first spiral member 5 moves towards the first end 2 of the support 1, the anti-node of the second spiral member 6 moves towards the second end 3 of the support 1, and vice versa. The first connector surface 21.1 of the damper body 21 may be attached to the first spiral member 5 at the position of the anti-node of the first spiral member 5 and the second connector surface 21.2 of the damper body 21 may be attached to the second spiral member 6 at the position of the anti-node of the second spiral member 6. This way, the anti-nodes inhibit each other's movement. This way, the local displacement of the first spiral member 5 of a location between two adjacent nodes is reduced.

In the embodiment of FIG. 4B, the coil spring comprises at least one free spiral member which is not in engagement with the damper device 20. In this embodiment, the free spiral members are the third spiral member 7, the fourth spiral member 8 and the fifth spiral member 9.

In the embodiment of FIG. 4B, the damper body 21 will be mainly subjected to tension and/or pressure.

The support 1 as shown in FIG. 4B can for example be manufactured by machining a tubular starting material, e.g. a steel tube (e.g. a stainless steel tube), an aluminum tube or a plastic tube and subsequently attaching the damper body 21 at the desired position. The damper body 21 can for example be attached by gluing or by pre-tension.

Figure 5A:
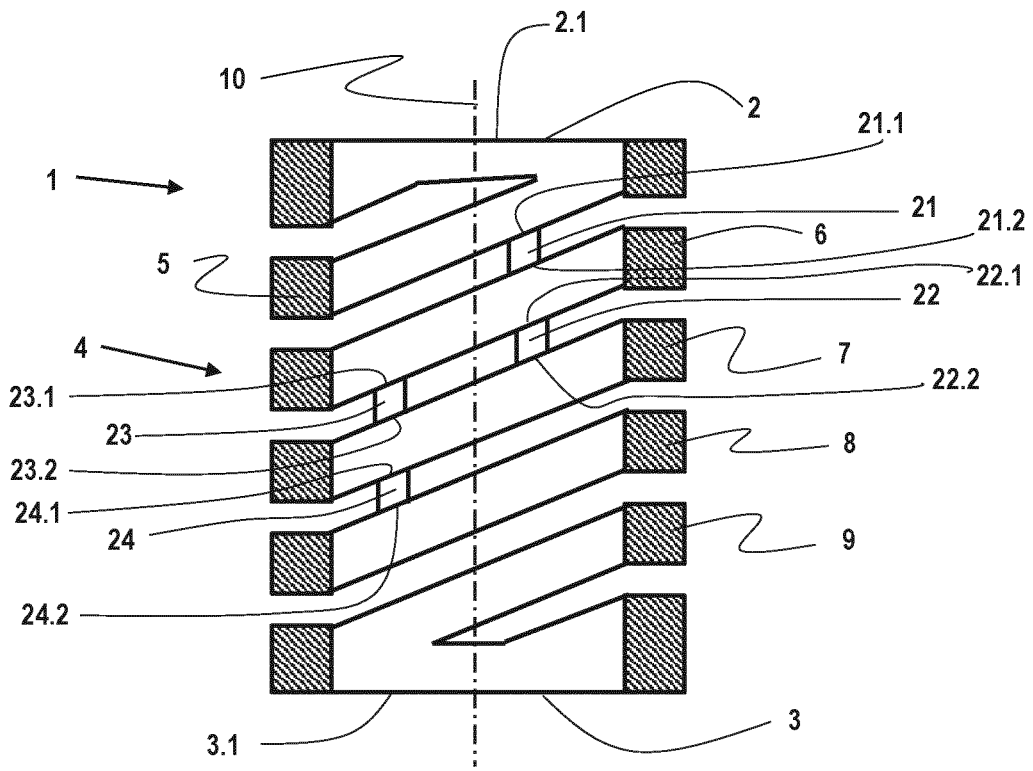
FIG. 5B schematically shows the variant of FIG. 5A in top view.
Figure 5B:
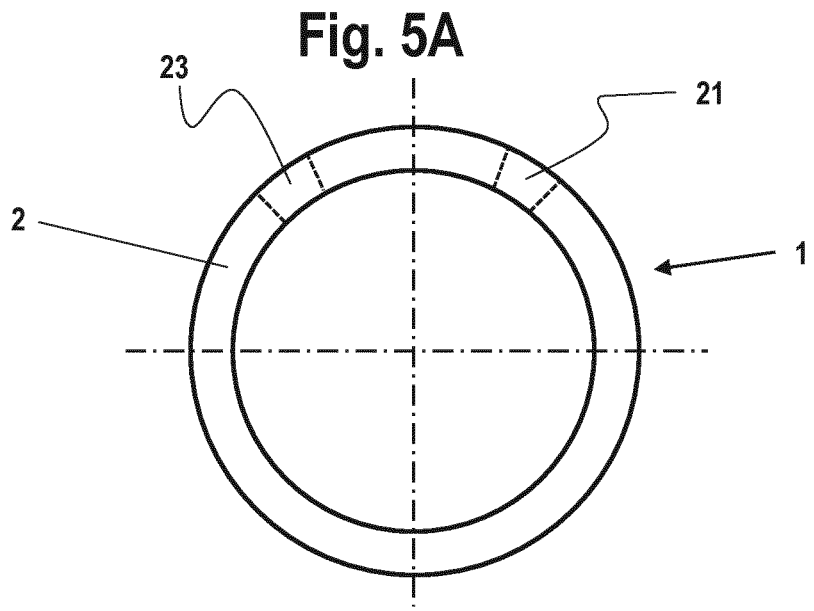

FIG. 5A schematically shows a further variant of the embodiment of FIG. 4B, in cross section. FIG. 5B schematically shows the variant of FIG. 5A in top view.

While in the embodiment of FIG. 4B the damper device 20 contains a single damper body 21, in the variant of FIGS. 5A and 5B, four damper bodies 21, 22, 23, 24 are present. Any other number of damper bodies than four is possible as an alternative. However, with the increase of the number of damper bodies, care should be taken not to increase the static stiffness of the support 1 too much.

The optimal number and optimal positioning of the damper bodies 21, 22, 23, 24 can be determined using modal analysis of the dynamic behavior of the individual spiral members 5, 6, 7, 8, 9.

In the embodiment of FIGS. 5A and 5B, the first damper body 21 is arranged between the first spiral member 5 and the second spiral member 6. The first damper body 21 has a first connector surface 21.1 which is connected to the first spiral member 5 and a second connector surface 21.2 which is connected to the second spiral member 6. The first damper body 21 comprises a material having vibration dampening properties, e.g. a visco-elastic material. Optionally, the first damper body 21 is made of a material having vibration dampening properties, e.g. a visco-elastic material.

In the embodiment of FIGS. 5A and 5B, the second damper body 22 is arranged between the second spiral member 6 and the third spiral member 7. The second damper body 22 has a first connector surface 22.1 which is connected to the second spiral member 6 and a second connector surface 22.2 which is connected to the third spiral member 7. The second damper body 22 comprises a material having vibration dampening properties, e.g. a visco-elastic material. Optionally, the second damper body 22 is made of a material having vibration dampening properties, e.g. a visco-elastic material.

In the embodiment of FIGS. 5A and 5B, the third damper body 23 is arranged between the second spiral member 6 and the third spiral member 7, like the second damper body 22 is. However, the second damper body 22 and the third damper body are arranged at different locations along the second and third spiral members 6, 7, respectively. This can be seen in the top view of FIG. 5B.

The third damper body 23 has a first connector surface 23.1 which is connected to the second spiral member 6 and a second connector surface 23.2 which is connected to the third spiral member 7. The third damper body 23 comprises a material having vibration dampening properties, e.g. a visco-elastic material. Optionally, the third damper body 23 is made of a material having vibration dampening properties, e.g. a visco-elastic material.

In the embodiment of FIGS. 5A and 5B, the fourth damper body 24 is arranged between the third spiral member 7 and the fourth spiral member 8. The fourth damper body 24 has a first connector surface 24.1 which is connected to the third spiral member 7 and a second connector surface 24.2 which is connected to the fourth spiral member 8. The fourth damper body 24 comprises a material having vibration dampening properties, e.g. a visco-elastic material. Optionally, the fourth damper body 24 is made of a material having vibration dampening properties, e.g. a visco-elastic material.

In the variant of FIGS. 5A and 5B, the coil spring comprises at least one free spiral member which is not in engagement with the damper device 20. In this variant, the free spiral member is the fifth spiral member 9.

In the variant of FIGS. 5A and 5B, the damper body 21 will be mainly subjected to tension and/or pressure.

The support 1 as shown in FIGS. 5A and 5B can for example be manufactured by machining a tubular starting material, e.g. a steel tube (e.g. a stainless steel tube), an aluminum tube or a plastic tube and subsequently attaching the damper bodies 21, 22, 23, 24 at the desired positions. The damper bodies 21, 22, 23, 24 can for example be attached by gluing or by pre-tension.

Figure 6A:
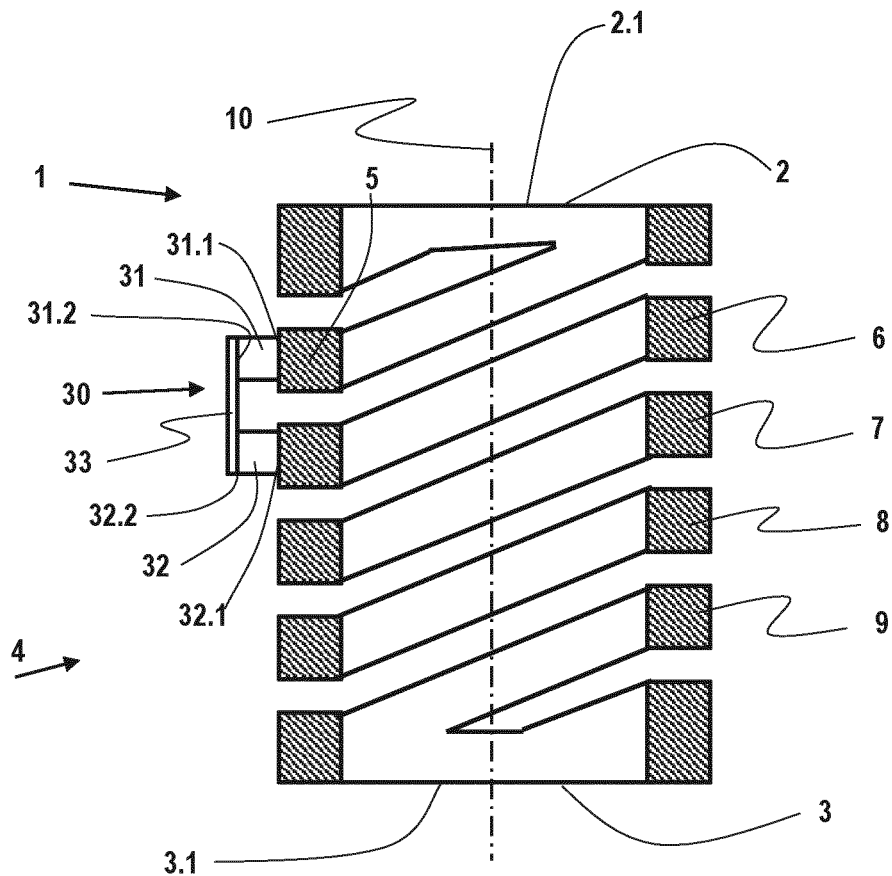
FIG. 6A schematically shows a second embodiment of a support according to the invention, in cross section, FIG. 6B schematically shows the embodiment of FIG. 6A in top view, FIG. 7A schematically shows a variant of the embodiment of FIGS. 6A and 6B, in cross section, FIG. 7B schematically shows the variant of FIG. 7A in top view, FIG. 8 schematically shows a third embodiment of a support according to the invention, in cross section, FIGS. 9A-9B schematically show a fourth embodiment of a support according to the invention, in cross section, FIG. 10 schematically shows a fifth embodiment of a support according to the invention, in cross section, FIG. 11 schematically shows an embodiment of a vibration isolation system 50 according to the invention, FIG. 12 schematically shows an embodiment of a lithographic apparatus 100 according to the invention.
Figure 6B:
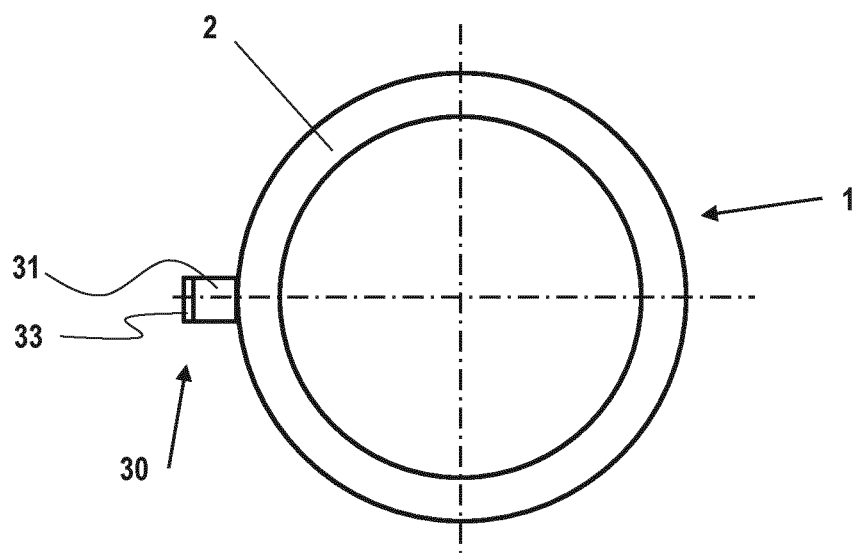

FIG. 6A schematically shows a second embodiment of a support 1 according to the invention, in cross section. FIG. 6B schematically shows the embodiment of FIG. 6A in top view.

The support 1 comprises a first end portion 2 and a second end portion 3. The second end portion 3 is on the side opposite to the first end portion 2 in a longitudinal direction of the support. The first end portion 2 has a body engagement face 2.1 which is adapted to engage a body to be supported. The second end portion 3 has a bearing surface engagement face 3.1 which is adapted to engage a load bearing surface onto which the body is to be supported.

The support further comprises a coil spring 4. The coil spring 4 is arranged between the first end portion 2 and the second end portion 3. In the embodiment of FIGS. 6A and 6B, the coil spring comprises multiple spiral members 5, 6, 7, 8, 9. These spiral members include a first spiral member 5 and a second spiral member 6. All spiral members extend between the first end portion 2 and the second end 3 portion in a circumferential direction of the support 1. Each spiral member 5, 6, 7, 8, 9 has a helical shape which extends between the first end portion 2 and the second end portion 3. Each individual spiral member 5, 6, 7, 8, 9 has its own first end which engages the first end portion 2 of the support 1 and its own opposite second end which engages the second end portion 3 of the support 1. The spiral members 5, 6, 7, 8, 9 are moveable relative to each other, for example in the longitudinal direction of the support 1. In particular, the first spiral member 5 of the coil spring 4 and the second spiral member 6 of the coil spring 4 are moveable relative to each other, e.g. in the longitudinal direction of the support 1. In the embodiment of FIGS. 6A and 6B, the longitudinal axes of all spiral members 5, 6, 7, 8, 9 coincide with each other. In the unloaded situation of the support, adjacent spiral members 5, 6, 7, 8, 9 are substantially parallel to each other.

In the embodiment of FIGS. 6A and 6B, the spiral members have a square cross section. However, alternatively or in addition, other cross sectional shapes are possible as well, such as circular, elliptical, rectangular, and or trapezoid.

The dimensions of the cross section of a spiral member may be constant or may vary over the length of the spiral member (i.e. along the helical direction in which the spiral member extends around the longitudinal axis 10 of the support).

The cross sectional dimensions optionally are the same for all spiral members. Alternatively, different spiral members have different cross sectional dimensions.

In the example of FIGS. 6A and 6B, the outer diameter of the coil spring 4 is constant over the length of the coil spring 4. Alternatively, the outer diameter may vary over the length of the coil spring. In the example of FIGS. 6A and 6B, the inner diameter of the coil spring 4 is constant over the length of the coil spring 4. Alternatively, the inner diameter may vary over the length of the coil spring.

It has been observed at relatively high frequencies, e.g. frequencies above 1 kHz, e.g. between 1400 Hz and 1600 Hz, the spiral members 5, 6, 7, 8, 9 may have mutually different vibration mode shapes associated with the same vibration frequency. For example, the first spiral member 5 may have a different mode shape than the second spiral member 6 at the same vibration frequency.

In accordance with the embodiment of FIGS. 6A and 6B, a damper device 30 is attached to the first spiral member 5. This damper device 30 reduces the displacement of the first spiral member 5 at at least one location between two adjacent nodes of a vibration mode shape of the first spiral member 5, e.g. in a vibration mode shape which is present in the first spiral member 5 at a frequency which is 1 kHz or higher. The damper device 30 is configured to dampen movement of the first spiral member 5 relative to at least one of the first end portion 2, the second end portion 3 and/or the second spiral member 6.

In the embodiment of FIGS. 6A and 6B, the damper device 30 comprises a first damper body 31. The first damper body 31 comprises a material having vibration dampening properties, e.g. a visco-elastic material. Optionally, the first damper body 31 is made of a material having vibration dampening properties, e.g. a visco-elastic material.

In the embodiment of FIGS. 6A and 6B, the first damper body 31 is arranged on the first spiral member 5. The first damper body 31 has a first connector surface 31.1 which is connected to the first spiral member 5.

The damper device 30 of FIGS. 6A and 6B further comprises a second damper body 32. The second damper body 32 comprises a material having vibration dampening properties, e.g. a visco-elastic material. Optionally, the second damper body 32 is made of a material having vibration dampening properties, e.g. a visco-elastic material.

In the embodiment of FIGS. 6A and 6B, the second damper body 32 is arranged on the second spiral member 6. The second damper body 31 has a first connector surface 32.1 which is connected to the second spiral member 6.

In the embodiment of FIGS. 6A and 6B, the damper device 30 further comprises a constrainer body 33. The constrainer body 33 optionally has a low stiffness in the lateral direction of the support 1, so that little static stiffness is added to the support 1 by applying the damper device 30.

In the embodiment of FIGS. 6A and 6B, the first damper body 31 comprises a second connector surface 31.2 which is connected to the constrainer body 33. The second damper body 32 comprises a second connector surface 32.2 which is connected to the constrainer body 33.

The damper device 30 connects the first spiral member 5 and the second spiral member 6 with each other via the first and second damper bodies 31, 32 and the constrainer body 33. Because of the damping properties of the material of the first and second damper bodies 31, 32, the displacement of the first spiral member 5 relative to at least one of the first end portion 2, the second end portion 3 and/or the second spiral member 6 due to a high frequency vibration mode shape (e.g. a vibration mode shape at a frequency above 1 kHz, e.g. at a frequency between 1400 Hz and 1600 Hz) is reduced.

In order to optimize the damping, the vibration mode shapes of the first spiral member 5 and the second spiral member 6 have to be considered at a certain vibration frequency, e.g. on the basis of an experimental and/or numerical modal analysis of the support, the coil spring and/or the spiral members. Based on the outcome of such a modal analysis, the optimal position of the damper device 30 can be determined.

For example, at a certain frequency, the first spiral member 5 has a vibration mode shape which comprises an anti-node, and the second spiral member 6 has a vibration mode shape which comprises a node. The first connector surface 31.1 of the first damper body 31 may be attached to the first spiral member 5 at the position of the anti-node and the first connector surface 32.2 of the second damper body 32 may be attached to the second spiral member 6 at the position of the node. This way, the node of the second spiral member 6 inhibits the movement of the anti-node of the first spiral member 5. This way, the local displacement of the first spiral member 5 of a location between two adjacent nodes is reduced.

Alternatively or in addition, for example the first spiral member 5 at a certain vibration frequency has a vibration mode shape which comprises an anti-node, and the second spiral member 6 at the same vibration frequency has a vibration mode shape which also comprises an anti-node, and the anti-nodes move out-of-phase which each other. So, when the anti-node of the first spiral member 5 moves towards the first end 2 of the support 1, the anti-node of the second spiral member 6 moves towards the second end 3 of the support 1, and vice versa. The first connector surface 31.1 of the first damper body 31 may be attached to the first spiral member 5 at the position of the anti-node of the first spiral member 5 and the first connector surface 32.1 of the second damper body 32 may be attached to the second spiral member 6 at the position of the anti-node of the second spiral member 6. This way, the anti-nodes inhibit each other's movement. This way, the local displacement of the first spiral member 5 of a location between two adjacent nodes is reduced.

In the embodiment of FIGS. 6A and 6B, the damper device 30 is arranged outside the outer circumference of the coil spring 4. This can be seen in FIG. 6B. Alternatively or in addition, the damper device 30 may be arranged within the inner diameter of the coil spring 4.

In the embodiment of FIGS. 6A and 6B, the damper bodies 31, 32 of the damper device 30 are connected to adjacent spiral members of the coil spring 4. However, alternatively or in addition, one or more free spiral members can be present between the spiral members to which a damper body is connected.

In the embodiment of FIGS. 6A and 6B, the coil spring comprises at least one free spiral member which is not in engagement with the damper device 30. In this embodiment, the free spiral members are the third spiral member 7, the fourth spiral member 8 and the fifth spiral member 9.

In the embodiment of FIGS. 6A and 6B, the damper bodies 31, 32 will be mainly subjected to shear.

Figure 7A:
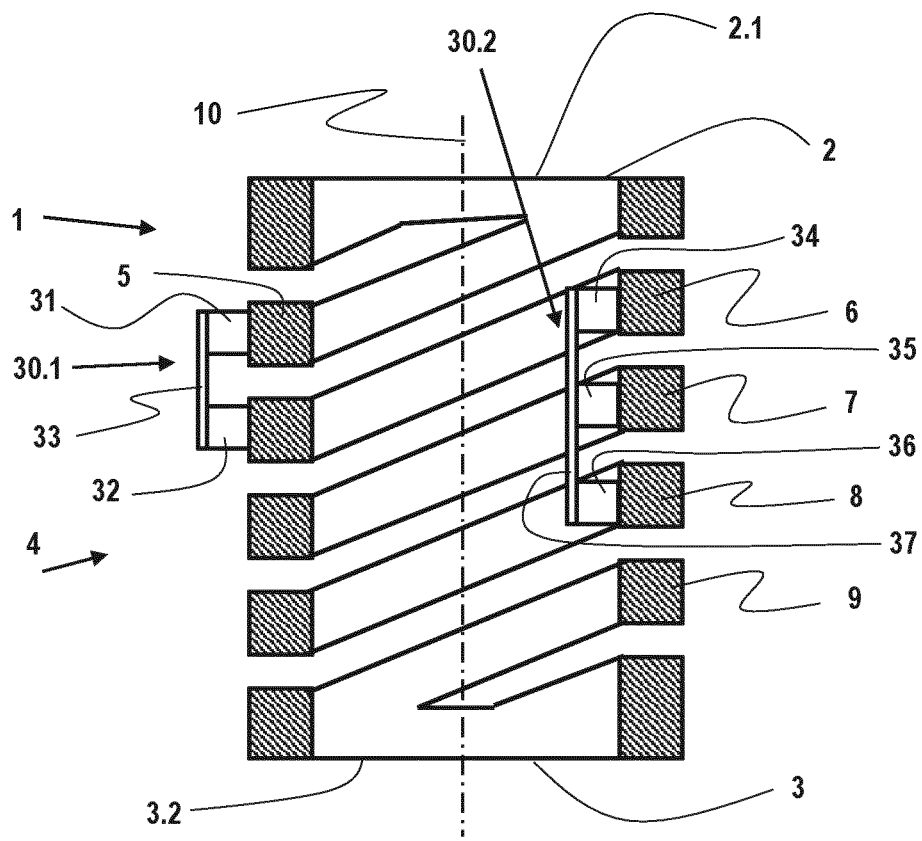
Figure 7B:
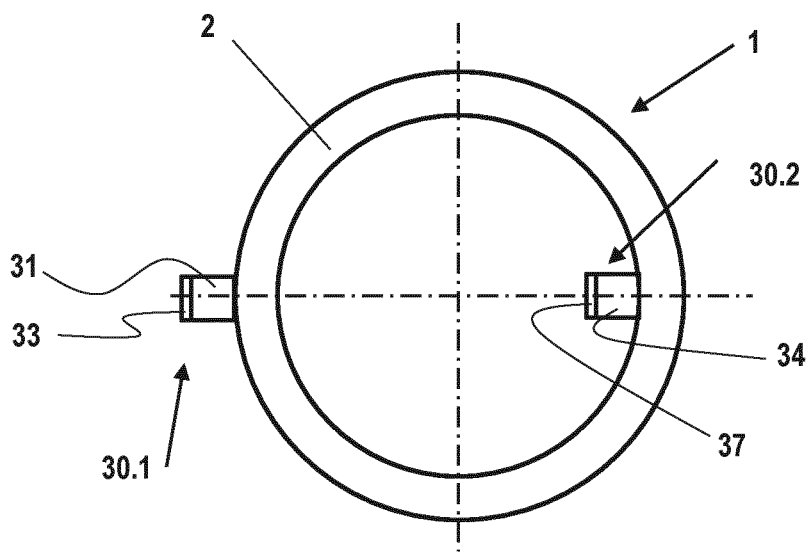

FIG. 7A schematically shows a variant of the embodiment of FIGS. 6A and 6B, in cross section. FIG. 7B schematically shows the variant of FIG. 7A in top view.

In the variant of FIGS. 7A and 7B, the support is provided with a first damper device 30.1 and a second damper device 30.2. The first damper device 30.1 is the same as the damper device 30 of the embodiment of FIGS. 6A and 6B. It is optionally also arranged in the same position as the damper device 30 of the embodiment of FIGS. 6A and 6B.

In the variant of FIGS. 7A and 7B, the second damper device 30.2 comprises a first damper body 34, a second damper body 35 and a third damper body 36. These damper bodies 34, 35, 36 all have a first connector surface which is attached to a spiral member of the coil spring 4. In the example of FIGS. 7A and 7B, the first damper body 34 of the second damper device 30.2 is connected to the second spiral member 6, the second damper body 35 of the second damper device 30.2 is connected to the third spiral member 7 and the third damper body 36 of the second damper device 30.2 is connected to the fourth spiral member 8.

In the variant of FIGS. 7A and 7B, the damper bodies 34, 35, 36 of the second damper device 30.2 are connected to adjacent spiral members of the coil spring 4. However, alternatively or in addition, one or more free spiral members can be present between the spiral members to which a damper body of the second damper device 30.2 is connected.

In the variant of FIGS. 7A and 7B, the second damper device 30.2 further comprises a constrainer body 37. The constrainer body 37 optionally has a low stiffness in the lateral direction of the support 1, so that little static stiffness is added to the support 1 by applying the second damper device 30.2. The damper bodies 34, 35, 36 all comprise a second connector surface which is connected to the constrainer body 37.

In the variant of FIGS. 7A and 7B, the coil spring comprises at least one free spiral member which is not in engagement with any of the damper devices 30.1, 30.2. In this embodiment, the free spiral member is the fifth spiral member 9.

In the variant of FIGS. 7A and 7B, the first damper device 30.1 is arranged outside the outer circumference of the coil spring 4 and the second damper device 30.2 is arranged within the inner diameter of the coil spring 4.

In the variant of FIGS. 7A and 7B, the damper bodies 31, 32, 34, 35, 36 will be mainly subjected to shear.

Figure 8:
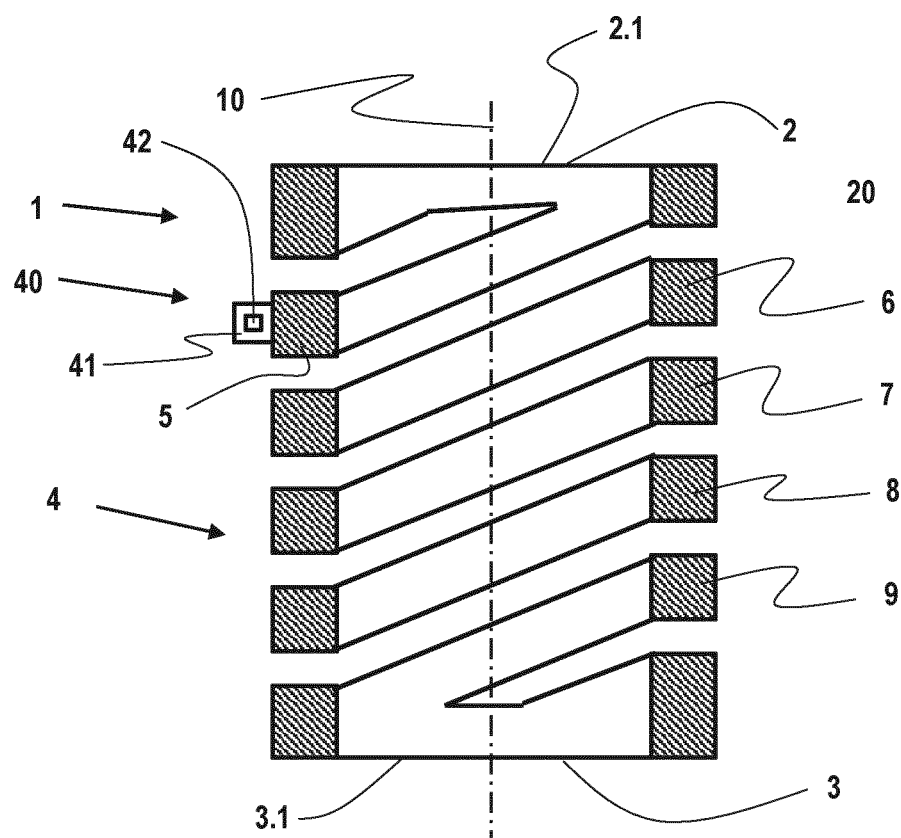

FIG. 8 schematically shows a third embodiment of a support 1 according to the invention, in cross section.

The support 1 comprises a first end portion 2 and a second end portion 3. The second end portion 3 is on the side opposite to the first end portion 2 in a longitudinal direction of the support. The first end portion 2 has a body engagement face 2.1 which is adapted to engage a body to be supported. The second end portion 3 has a bearing surface engagement face 3.1 which is adapted to engage a load bearing surface onto which the body is to be supported.

The support further comprises a coil spring 4. The coil spring 4 is arranged between the first end portion 2 and the second end portion 3. In the embodiment of FIG. 8, the coil spring comprises multiple spiral members 5, 6, 7, 8, 9. These spiral members include a first spiral member 5 and a second spiral member 6. All spiral members extend between the first end portion 2 and the second end 3 portion in a circumferential direction of the support 1. Each spiral member 5, 6, 7, 8, 9 has a helical shape which extends between the first end portion 2 and the second end portion 3. Each individual spiral member 5, 6, 7, 8, 9 has its own first end which engages the first end portion 2 of the support 1 and its own opposite second end which engages the second end portion 3 of the support 1. The spiral members 5, 6, 7, 8, 9 are moveable relative to each other, for example in the longitudinal direction of the support 1. In particular, the first spiral member 5 of the coil spring 4 and the second spiral member 6 of the coil spring 4 are moveable relative to each other, e.g. in the longitudinal direction of the support 1. In the embodiment of FIG. 8, the longitudinal axes of all spiral members 5, 6, 7, 8, 9 coincide with each other. In the unloaded situation of the support, adjacent spiral members 5, 6, 7, 8, 9 are substantially parallel to each other.

In the embodiment of FIG. 8, the spiral members have a square cross section. However, alternatively or in addition, other cross sectional shapes are possible as well, such as circular, elliptical, rectangular, and or trapezoid.

The dimensions of the cross section of a spiral member may be constant or may vary over the length of the spiral member (i.e. along the helical direction in which the spiral member extends around the longitudinal axis 10 of the support).

The cross sectional dimensions optionally are the same for all spiral members. Alternatively, different spiral members have different cross sectional dimensions.

In the example of FIG. 8, the outer diameter of the coil spring 4 is constant over the length of the coil spring 4. Alternatively, the outer diameter may vary over the length of the coil spring. In the example of FIG. 8, the inner diameter of the coil spring 4 is constant over the length of the coil spring 4. Alternatively, the inner diameter may vary over the length of the coil spring.

It has been observed at relatively high frequencies, e.g. frequencies above 1 kHz, e.g. between 1400 Hz and 1600 Hz, the spiral members 5, 6, 7, 8, 9 may have mutually different vibration mode shapes associated with the same vibration frequency. For example, the first spiral member 5 may have a different mode shape than the second spiral member 6 at the same vibration frequency.

In accordance with the embodiment of FIG. 8, a damper device 40 is attached to the first spiral member 5. This damper device 40 reduces the displacement of the first spiral member 5 at at least one location between two adjacent nodes of a vibration mode shape of the first spiral member 5, e.g. in a vibration mode shape which is present in the first spiral member 5 at a frequency which is 1 kHz or higher. The damper device 40 is configured to dampen movement of the first spiral member 5 relative to at least one of the first end portion 2, the second end portion 3 and/or the second spiral member 6.

In the embodiment of FIG. 8, the damper device 40 comprises a tuned mass damper 41. The tuned mass damper 41 is attached to the first spiral member 5. The tuned mass damper 41 is configured to dampen the displacement of at least a part of the first spiral member 5 in at least one vibration mode shape.

The optimal position of the tuned mass damper is determined by modal analysis of the vibration mode shapes of the individual spiral members 5, 6, 7, 8, 9 of the coil spring 4.

The tuned mass damper 41 comprises a damper body 42 which has a damper body mass. The optimal damper body mass is also determined on the basis of the modal analyses of the vibration mode shapes of the individual spiral members 5, 6, 7, 8, 9 of the coil spring 4. For example, the damper body mass is less than 50 grams, preferably less than 20 grams, optionally between 2 and 15 grams.

The support 1 as shown in FIG. 8 can for example be manufactured by machining a tubular starting material, e.g. a steel tube (e.g. a stainless steel tube), an aluminum tube or a plastic tube and subsequently attaching the tuned mass damper 41 at the desired position. The tuned mass damper can for example be attached by gluing or by pre-tension.

Figure 9A:
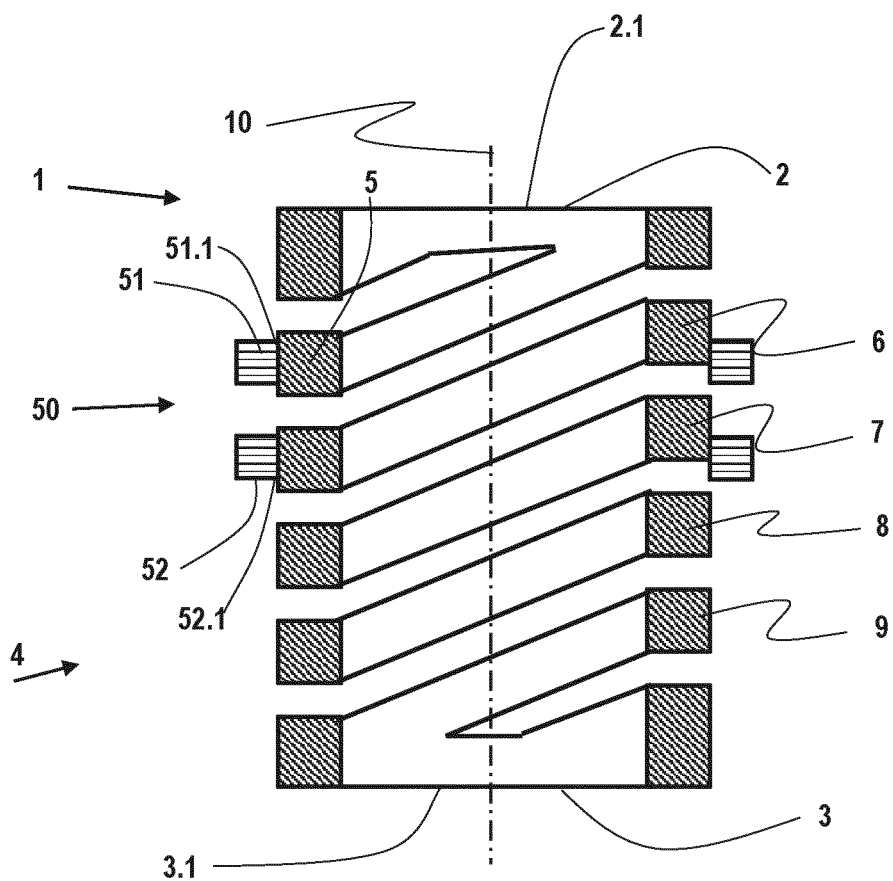
Figure 9B:
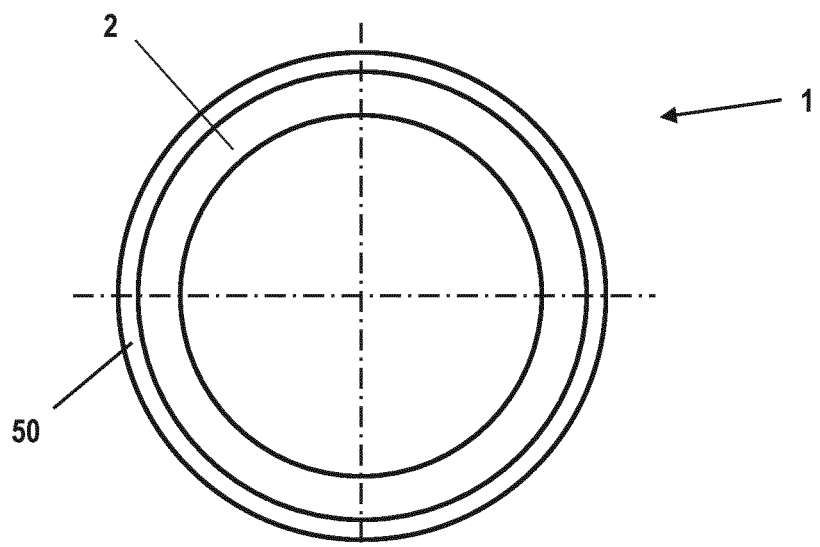

FIG. 9A schematically shows a fourth embodiment of a support 1 according to the invention, in cross section. FIG. 9B schematically shows the embodiment of FIG. 9A in top view.

The support 1 comprises a first end portion 2 and a second end portion 3. The second end portion 3 is on the side opposite to the first end portion 2 in a longitudinal direction of the support. The first end portion 2 has a body engagement face 2.1 which is adapted to engage a body to be supported. The second end portion 3 has a bearing surface engagement face 3.1 which is adapted to engage a load bearing surface onto which the body is to be supported.

The support further comprises a coil spring 4. The coil spring 4 is arranged between the first end portion 2 and the second end portion 3. In the embodiment of FIGS. 9A and 9B, the coil spring comprises multiple spiral members 5, 6, 7, 8, 9. These spiral members include a first spiral member 5 and a second spiral member 6. All spiral members extend between the first end portion 2 and the second end 3 portion in a circumferential direction of the support 1. Each spiral member 5, 6, 7, 8, 9 has a helical shape which extends between the first end portion 2 and the second end portion 3. Each individual spiral member 5, 6, 7, 8, 9 has its own first end which engages the first end portion 2 of the support 1 and its own opposite second end which engages the second end portion 3 of the support 1. The spiral members 5, 6, 7, 8, 9 are moveable relative to each other, for example in the longitudinal direction of the support 1. In particular, the first spiral member 5 of the coil spring 4 and the second spiral member 6 of the coil spring 4 are moveable relative to each other, e.g. in the longitudinal direction of the support 1. In the embodiment of FIGS. 9A and 9B, the longitudinal axes of all spiral members 5, 6, 7, 8, 9 coincide with each other. In the unloaded situation of the support, adjacent spiral members 5, 6, 7, 8, 9 are substantially parallel to each other.

In the embodiment of FIGS. 9A and 9B, the spiral members have a square cross section. However, alternatively or in addition, other cross sectional shapes are possible as well, such as circular, elliptical, rectangular, and or trapezoid.

The dimensions of the cross section of a spiral member may be constant or may vary over the length of the spiral member (i.e. along the helical direction in which the spiral member extends around the longitudinal axis 10 of the support).

The cross sectional dimensions optionally are the same for all spiral members. Alternatively, different spiral members have different cross sectional dimensions.

In the example of FIGS. 9A and 9B, the outer diameter of the coil spring 4 is constant over the length of the coil spring 4. Alternatively, the outer diameter may vary over the length of the coil spring. In the example of FIGS. 9A and 9B, the inner diameter of the coil spring 4 is constant over the length of the coil spring 4. Alternatively, the inner diameter may vary over the length of the coil spring.

It has been observed at relatively high frequencies, e.g. frequencies above 1 kHz, e.g. between 1400 Hz and 1600 Hz, the spiral members 5, 6, 7, 8, 9 may have mutually different vibration mode shapes associated with the same vibration frequency. For example, the first spiral member 5 may have a different mode shape than the second spiral member 6 at the same vibration frequency.

In accordance with the embodiment of FIGS. 9A and 9B, a damper device 50 is attached to the first spiral member 5. This damper device 50 reduces the displacement of the first spiral member 5 at at least one location between two adjacent nodes of a vibration mode shape of the first spiral member 5, e.g. in a vibration mode shape which is present in the first spiral member 5 at a frequency which is 1 kHz or higher. The damper device 50 is configured to dampen a movement of the first spiral member 5 relative to at least one of the first end portion 2, the second end portion 3 and/or the second spiral member 6.

In the embodiment of FIGS. 9A and 9B, the damper device 50 comprises a first damper body 51. The first damper body 51 comprises a material having vibration dampening properties, e.g. a visco-elastic material. Optionally, the first damper body 51 is made of a material having vibration dampening properties, e.g. a visco-elastic material.

In the embodiment of FIGS. 9A and 9B, the first damper body 51 is arranged on the first spiral member 5. The first damper body 51 is ring shaped and has a first connector surface 51.1 which is connected to the first spiral member 5.

The damper device 50 of FIGS. 9A and 9B may further comprises a second damper body 52. The second damper body 52 comprises a material having vibration dampening properties, e.g. a visco-elastic material. Optionally, the second damper body 52 is made of a material having vibration dampening properties, e.g. a visco-elastic material.

In the embodiment of FIGS. 9A and 9B, the second damper body 52 is arranged on the second spiral member 6. The second damper body 52 is ring shaped and has a first connector surface 52.1 which is connected to the second spiral member 6.

The damper device 50 as shown in FIGS. 9A and 9B connects the first spiral member 5 and the second spiral member 6 with each other via the first damper body 51. Because of the damping properties of the material of the first damper body 51 the displacement of the first spiral member 5 relative to at least one of the first end portion 2, the second end portion 3 and/or the second spiral member 6 due to a high frequency vibration mode shape (e.g. a vibration mode shape at a frequency above 1 kHz, e.g. at a frequency between 1400 Hz and 1600 Hz) is reduced.

The embodiment of the damper device 50 as shown in FIGS. 9A and 9B furthermore connects the spiral member 6 and the spiral member 7 with each other via the second damper body 52. Because of the damping properties of the material of the second damper body 52 the displacement of the spiral member 6 relative to at least one of the first end portion 2, the second end portion 3 and/or the spiral member 7 due to a high frequency vibration mode shape (e.g. a vibration mode shape at a frequency above 1 kHz, e.g. at a frequency between 1400 Hz and 1600 Hz) is reduced.

In order to optimize the damping, the vibration mode shapes of the first spiral member 5 and the second spiral member 6 have to be considered at a certain vibration frequency, e.g. on the basis of an experimental and/or numerical modal analysis of the support, the coil spring and/or the spiral members. Based on the outcome of such a modal analysis, the optimal position of the damper device 50 can be determined.

For example, at a certain frequency, the first spiral member 5 has a vibration mode shape which comprises an anti-node, and the second spiral member 6 has a vibration mode shape which comprises a node. The first damper body 51 may be attached to the first spiral member 5 at the position of the anti-node and may be attached to the second spiral member 6 at the position of the node. This way, the node of the second spiral member 6 inhibits the movement of the anti-node of the first spiral member 5. This way, the local displacement of the first spiral member 5 of a location between two adjacent nodes is reduced.

Alternatively or in addition, for example the first spiral member 5 at a certain vibration frequency has a vibration mode shape which comprises an anti-node, and the second spiral member 6 at the same vibration frequency has a vibration mode shape which also comprises an anti-node, and the anti-nodes move out-of-phase which each other. So, when the anti-node of the first spiral member 5 moves towards the first end 2 of the support 1, the anti-node of the second spiral member 6 moves towards the second end 3 of the support 1, and vice versa. The first connector surface 51.1 of the first damper body 51 may be attached to the first spiral member 5 at the position of the anti-node of the first spiral member 5 may be attached to the second spiral member 6 at the position of the anti-node of the second spiral member 6. This way, the anti-nodes inhibit each other's movement. This way, the local displacement of the first spiral member 5 of a location between two adjacent nodes is reduced.

In the embodiment of FIGS. 9A and 9B, the damper device 50 is arranged at the outer circumference of the coil spring 4. The inventors have discovered that the resulting amount of damping is dependent from the number of damper bodies and the cross-sectional dimension of such damper bodies. The damping device 50 can for example be attached by pre-tension.

In the embodiment of FIGS. 9A and 9B, the damper bodies 51, 52 of the damper device 50 are connected to adjacent spiral members of the coil spring 4. However, alternatively or in addition, one or more spiral members may be present between the spiral members to which a damper body is connected.

In the embodiment of FIGS. 9A and 9B, the damper bodies 51, 52 of the damper device 50 are connected to adjacent spiral members of the coil spring 4. However, alternatively or in addition, one or more spiral members can be present at the same spiral members to which a damper body is connected.

Figure 10:
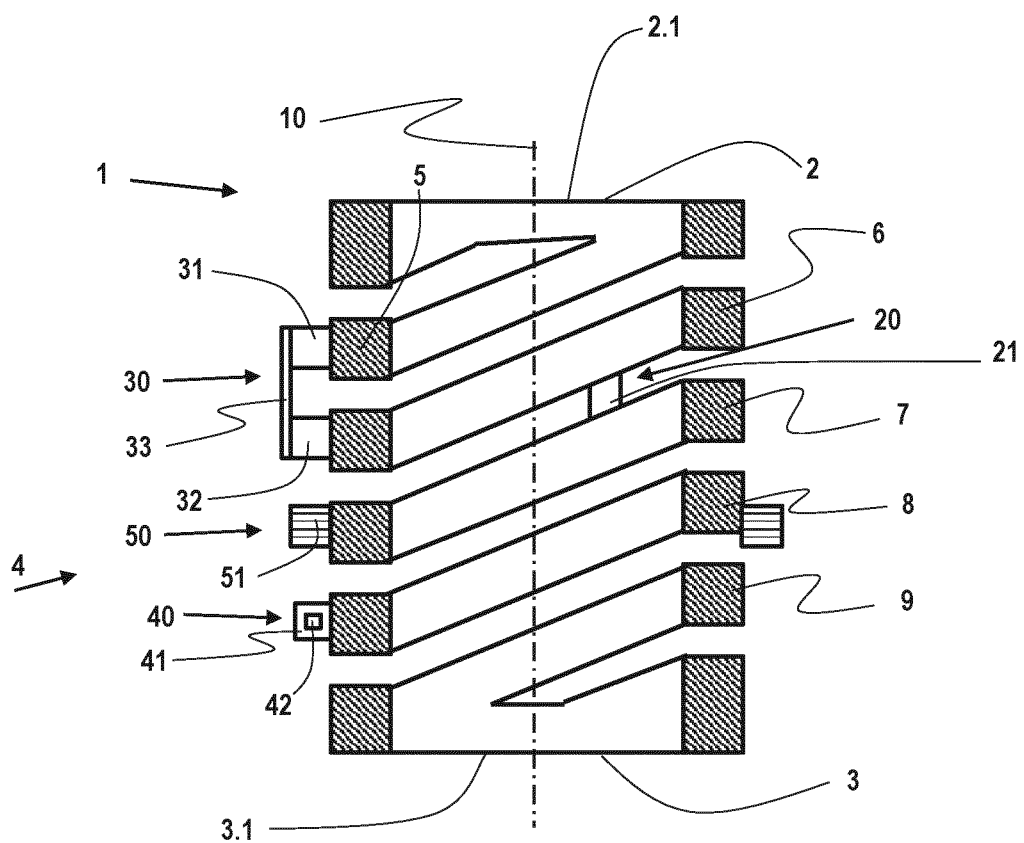

FIG. 10 schematically shows a fifth embodiment of a support 1 according to the invention, in cross section. In this embodiment, different types of damper devices are applied.

The support 1 comprises a first end portion 2 and a second end portion 3. The second end portion 3 is on the side opposite to the first end portion 2 in a longitudinal direction of the support. The first end portion 2 has a body engagement face 2.1 which is adapted to engage a body to be supported. The second end portion 3 has a bearing surface engagement face 3.1 which is adapted to engage a load bearing surface onto which the body is to be supported.

The support further comprises a coil spring 4. The coil spring 4 is arranged between the first end portion 2 and the second end portion 3. In the embodiment of FIG. 10, the coil spring comprises multiple spiral members 5, 6, 7, 8, 9. These spiral members include a first spiral member 5 and a second spiral member 6. All spiral members extend between the first end portion 2 and the second end 3 portion in a circumferential direction of the support 1. Each spiral member 5, 6, 7, 8, 9 has a helical shape which extends between the first end portion 2 and the second end portion 3. Each individual spiral member 5, 6, 7, 8, 9 has its own first end which engages the first end portion 2 of the support 1 and its own opposite second end which engages the second end portion 3 of the support 1. The spiral members 5, 6, 7, 8, 9 are moveable relative to each other, for example in the longitudinal direction of the support 1. In particular, the first spiral member 5 of the coil spring 4 and the second spiral member 6 of the coil spring 4 are moveable relative to each other, e.g. in the longitudinal direction of the support 1. In the embodiment of FIG. 10, the longitudinal axes of all spiral members 5, 6, 7, 8, 9 coincide with each other. In the unloaded situation of the support, adjacent spiral members 5, 6, 7, 8, 9 are substantially parallel to each other.

In the embodiment of FIG. 10, the spiral members have a square cross section. However, alternatively or in addition, other cross sectional shapes are possible as well, such as circular, elliptical, rectangular, and or trapezoid.

The dimensions of the cross section of a spiral member may be constant or may vary over the length of the spiral member (i.e. along the helical direction in which the spiral member extends around the longitudinal axis 10 of the support).

The cross sectional dimensions optionally are the same for all spiral members. Alternatively, different spiral members have different cross sectional dimensions.

In the example of FIG. 10, the outer diameter of the coil spring 4 is constant over the length of the coil spring 4. Alternatively, the outer diameter may vary over the length of the coil spring. In the example of FIG. 10, the inner diameter of the coil spring 4 is constant over the length of the coil spring 4. Alternatively, the inner diameter may vary over the length of the coil spring.

It has been observed at relatively high frequencies, e.g. frequencies above 1 kHz, e.g. between 1400 Hz and 1600 Hz, the spiral members 5, 6, 7, 8, 9 may have mutually different vibration mode shapes associated with the same vibration frequency. For example, the first spiral member 5 may have a different mode shape than the second spiral member 6 at the same vibration frequency.

In the embodiment of FIG. 10, three damper devices 20, 30, 40, 50 are arranged on spiral members of the coil spring 4. These damper devices 20, 30, 40, 50 are in this embodiment all different types of damper devices. Alternatively, only two damper devices of different types can be used, or three or more damper devices of which at least two damper devices are of the same type.

In accordance with the embodiment of FIG. 10, a first damper device 20 is attached to the second spiral member 6. This damper device 20 reduces the displacement of the second spiral member 6 at at least one location between two adjacent nodes of a vibration mode shape of the second spiral member 6, e.g. in a vibration mode shape which is present in the first spiral member 5 at a frequency which is 1 kHz or higher. The damper device 20 is configured to dampen movement of the second spiral member 6 relative to at least one of the first end portion 2, the second end portion 3 and/or the third spiral member 7.

In the embodiment of FIG. 10, the damper device 20 comprises a first damper body 21. The damper body 21 comprises a material having vibration dampening properties, e.g. a visco-elastic material. Optionally, the first damper body 21 is made of a material having vibration dampening properties, e.g. a visco-elastic material.

In the embodiment of FIG. 10, the first damper body 21 is arranged between the second spiral member 6 and the third spiral member 7.

The damper body 21 connects the second spiral member 6 and the third spiral member 7 with each other. Because of the damping properties of the material of the damper body, the displacement of the second spiral member 6 relative to at least one of the first end portion 2, the second end portion 3 and/or the third spiral member 7 due to a high frequency vibration mode shape (e.g. a vibration mode shape at a frequency above 1 kHz, e.g. at a frequency between 1400 Hz and 1600 Hz) is reduced.

In accordance with the embodiment of FIG. 10, a second damper device 30 is attached to the first spiral member 5. This second damper device 30 reduces the displacement of the first spiral member 5 at at least one location between two adjacent nodes of a vibration mode shape of the first spiral member 5, e.g. in a vibration mode shape which is present in the first spiral member 5 at a frequency which is 1 kHz or higher. The second damper device 30 is configured to dampen movement of the first spiral member 5 relative to at least one of the first end portion 2, the second end portion 3 and/or the second spiral member 6.

In the embodiment of FIG. 10, the second damper device 30 comprises a first damper body 31. The first damper body 31 comprises a material having vibration dampening properties, e.g. a visco-elastic material. Optionally, the first damper body 31 is made of a material having vibration dampening properties, e.g. a visco-elastic material.

In the embodiment of FIG. 10, the first damper body 31 is arranged on the first spiral member 5.

The second damper device 30 of FIG. 10 further comprises a second damper body 32. The second damper body 32 comprises a material having vibration dampening properties, e.g. a visco-elastic material. Optionally, the second damper body 32 is made of a material having vibration dampening properties, e.g. a visco-elastic material.

In the embodiment of FIG. 10, the second damper body 32 is arranged on the second spiral member 6.

In the embodiment of FIG. 10, the second damper device 30 further comprises a constrainer body 33. The constrainer body 33 optionally has a low stiffness in the lateral direction of the support 1, so that little static stiffness is added to the support 1 by applying the damper device 30.

In the embodiment of FIG. 10, the first damper body 31 and the second damper body 32 are connected to the constrainer body 33.

The second damper device 30 connects the first spiral member 5 and the second spiral member 6 with each other via the first and second damper bodies 31, 32 and the constrainer body 33. Because of the damping properties of the material of the first and second damper bodies 31, 32, the displacement of the first spiral member 5 relative to at least one of the first end portion 2, the second end portion 3 and/or the second spiral member 6 due to a high frequency vibration mode shape (e.g. a vibration mode shape at a frequency above 1 kHz, e.g. at a frequency between 1400 Hz and 1600 Hz) is reduced.

In accordance with the embodiment of FIG. 10, a third damper device 40 is attached to the fourth spiral member 8. This third damper device 40 reduces the displacement of the fourth spiral member 8 at at least one location between two adjacent nodes of a vibration mode shape of the fourth spiral member 8, e.g. in a vibration mode shape which is present in the fourth spiral member 8 at a frequency which is 1 kHz or higher. The third damper device 40 is configured to dampen movement of the fourth spiral member 8 relative to at least one of the first end portion 2, the second end portion 3 and/or the second spiral member 6.

In the embodiment of FIG. 10, the damper device 40 comprises a tuned mass damper 41. The tuned mass damper 41 is attached to the fourth spiral member 8. The tuned mass damper 41 is configured to dampen the displacement of at least a part of the fourth spiral member 8 in at least one vibration mode shape.

The optimal position of the tuned mass damper is determined by modal analysis of the vibration mode shapes of the individual spiral members 5, 6, 7, 8, 9 of the coil spring 4.

The tuned mass damper 41 comprises a damper body 42 which has a damper body mass. The optimal damper body mass is also determined on the basis of the modal analysis of the vibration mode shapes of the individual spiral members 5, 6, 7, 8, 9 of the coil spring 4. For example, the damper body mass is less than 50 grams, preferably less than 20 grams, optionally between 2 and 15 grams.

In accordance with the embodiment of FIG. 10, a fourth damper device 50 is attached to the third spiral member 7. This fourth damper device 50 reduces the displacement of the third spiral member 7 at at least one location between two adjacent nodes of a vibration mode shape of the third spiral member 7, e.g. in a vibration mode shape which is present in the third spiral member 7 at a frequency which is 1 kHz or higher. The fourth damper device 50 is configured to dampen movement of the third spiral member 7 relative to at least one of the first end portion 2, the second end portion 3 and/or the fourth spiral member 8.

In the embodiment of FIG. 10, the fourth damper device 50 comprises a first damper body 51. The first damper body 51 comprises a material having vibration dampening properties, e.g. a visco-elastic material. Optionally, the first damper body 51 is made of a material having vibration dampening properties, e.g. a visco-elastic material.

In the embodiment of FIG. 10, the first damper body 51 is arranged on the third spiral member 7.

The fourth damper device 50 connects the third spiral member 7 and the fourth spiral member 8 with each other. Because of the damping properties of the material of the first damper bodies 51, the displacement of the third spiral member 7 relative to at least one of the first end portion 2, the second end portion 3 and/or the fourth spiral member 8 due to a high frequency vibration mode shape (e.g. a vibration mode shape at a frequency above 1 kHz, e.g. at a frequency between 1400 Hz and 1600 Hz) is reduced.

Figure 11:
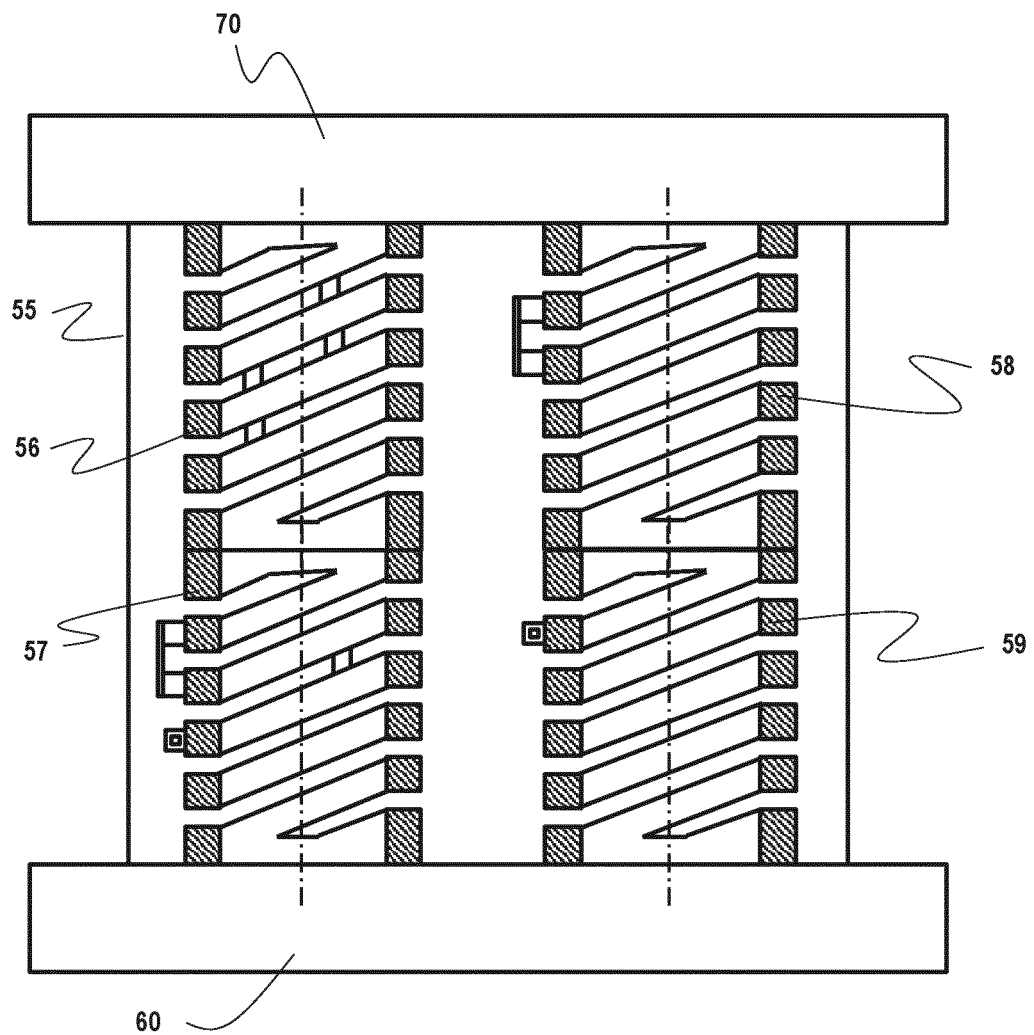

FIG. 11 schematically shows an embodiment of a vibration isolation system 50 according to the invention.

The vibration isolation system 55 is mounted onto a load bearing surface 60. The vibration isolation system supports a body 70.

The vibration isolation system 55 in this embodiment comprises multiple supports 56, 57, 58, 59. These supports 56, 57, 58, 59 are supports which are in accordance with some of the embodiments as described above.

In the embodiment of FIG. 11, the vibration isolation system comprises four supports 56, 57, 58, 59. The supports 56, 57, 58, 59 are arranged in two pairs. The supports within a pair are arranged in series with each other. The pairs are arranged in parallel with each other. The pairs can be mirrored with respect to each other.

In the embodiment of FIG. 11, the first support 56 of the vibration isolation system 50 is a support in accordance with FIGS. 5A and 5B. The second support 57 is a support in accordance with an embodiment of FIG. 10. The first support 56 and the second support 57 are arranged in series with each other.

In the embodiment of FIG. 11, the third support 58 of the vibration isolation system 55 is a support in accordance with FIGS. 7A and 7B. The fourth support 59 is a support in accordance with FIG. 8. The third support 58 and the fourth support 59 are arranged in series with each other.

Figure 12:
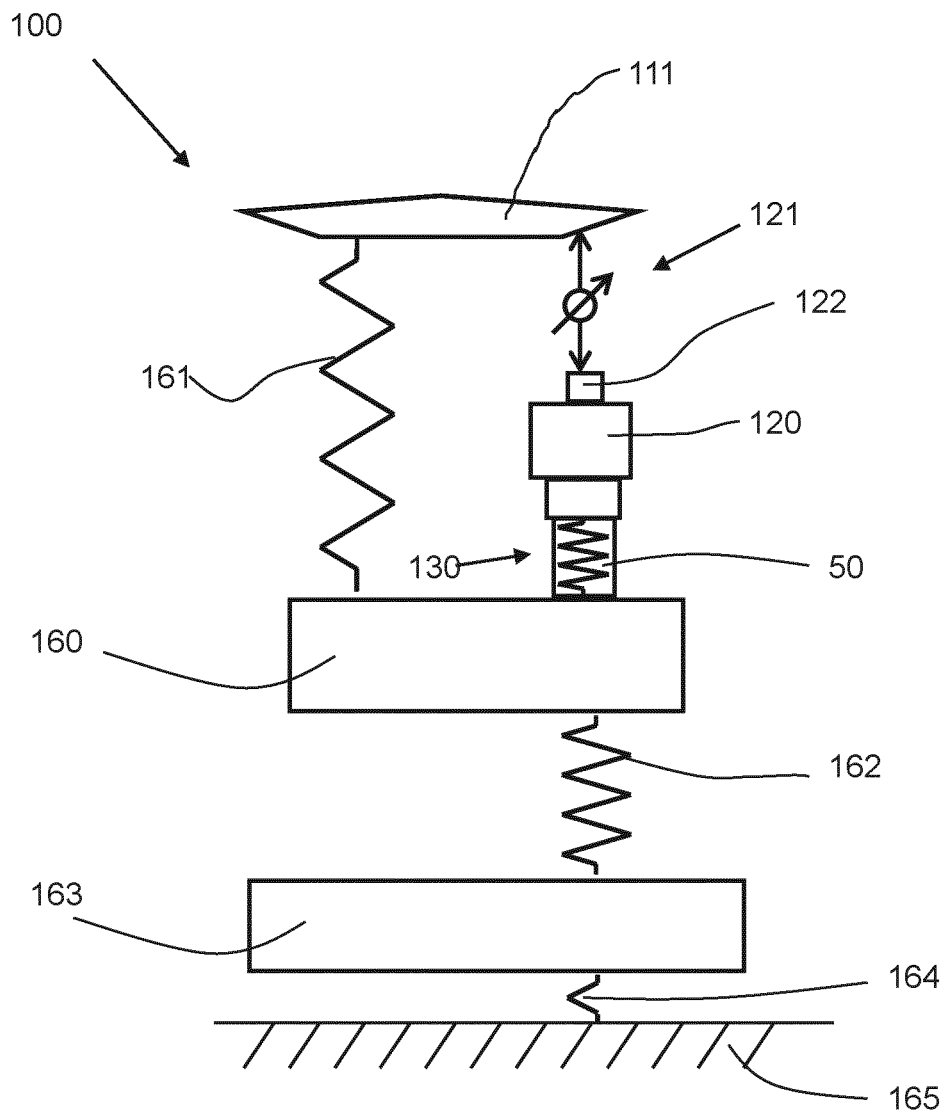

FIG. 12 schematically shows an embodiment of a lithographic apparatus according to the invention.

FIG. 12 shows one optical element 111 of the plurality of optical elements that is present in the projection system in the lithographic apparatus 100 according to the invention. The projection system is configured to project a patterned radiation beam onto a substrate which is arranged in the lithographic apparatus.

In the embodiment of FIG. 12, the lithographic apparatus 100 further comprises a sensor frame 120 and a first position measurement system 121 which is configured to measure a position of at least one of the plurality of optical elements relative to the sensor frame 120. In the embodiment of FIG. 12, the position measurement system 121 comprises at least one sensor adapted to monitor position information of the optical element 111. The sensor comprises at least one sensor element 122 which is mounted to the sensor frame 120.

The embodiment of the lithographic apparatus 100 according to FIG. 12 further comprises a sensor frame support 130 which is configured to support the sensor frame 120 on a reference. The reference is for example a further frame which is present in the lithographic apparatus 100, such as a force frame 160 or a base frame. The force frame 160 is the frame which supports the plurality of optical elements of the projection system, in particular the optical element 111.

In the embodiment of FIG. 12, the optical element 111 is for example supported by a force frame 160. The optical element 111 is connected to the force frame 160 by an optical element support 161. Optionally, the optical element support 161 comprises an actuator for moving the optical element 111 relative to the force frame 160.

Optionally, the sensor frame support 130 is connected to the force frame 160 so that the sensor frame 120 is supported by the force frame 160 as well. So, in the embodiment of FIG. 12, the force frame 160 is the reference onto which the sensor frame 120 is supported.

It is noted that alternative configurations of supporting the optical element 111 and/or the sensor frame 130 in the lithographic apparatus 1 are possible as well.

The force frame 160 is optionally connected to a base frame 163 via a force frame support 162. The force frame support 162 may for example be a passive support such as e.g an air mount. The base frame 163 is supported onto a support surface 165 via mount 164.

Optionally, in the embodiment shown in FIG. 12, the sensor frame support 130 comprises at least one vibration isolation system 50, which is for example a vibration isolation system according to FIG. 11. Optionally, the sensor frame support 130 comprises a plurality of vibration isolation systems 50, e.g. three or four vibration isolation systems 50.

Optionally, the vibration isolation system 50 is an active vibration isolation system, which comprises an actuator to actively move and/or actively position and/or actively dampen the position of the sensor frame 120.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A support comprising:
   a first end portion and a second end portion, wherein the second end portion is on a side opposite to the first end portion in a longitudinal direction of the support; and
   a coil spring that is arranged between the first end portion and the second end portion, the coil spring comprising:
   a first spiral member that extends between the first end portion and the second end portion in a circumferential direction of the support; and
   a second spiral member that extends between the first end portion and the second end portion in a circumferential direction of the support,
   wherein the first spiral member and the second spiral member extend in the longitudinal direction around a same longitudinal axis of the support,
   wherein the first spiral member of the coil spring and the second spiral member of the coil spring are moveable relative to each other, and
   wherein the support further comprises a damper device that is attached to the first spiral member.

2. The support of claim 1, wherein the damper device is configured to dampen movement of the first spiral member relative to at least one of the first end portion, the second end portion and/or the second spiral member.

3. The support of claim 1, wherein the first spiral member of the coil spring and the second spiral member of the coil spring are moveable relative to each other in the longitudinal direction of the support.

4. The support of claim 1, wherein the first spiral member has a vibration mode shape that comprises an anti-node, and wherein the damper device is attached to the first spiral member at the anti-node.

5. The support of claim 1, wherein the coil spring comprises at least one free spiral member that is not in engagement with the damper device, wherein the free spiral member is the second spiral member and/or a further spiral member other than the first or the second spiral member.

6. The support of claim 1, wherein the damper device comprises a first damper body comprising:
   a material having vibration dampening properties, wherein the first damper body has a first connector surface that is connected to the first spiral member.

7. The support of claim 6, wherein the first damper body further comprises a second connector surface that is connected to the second spiral member.

8. The support of claim 7, wherein the first spiral member has a vibration mode shape associated with a vibration frequency,
   wherein the vibration mode shape comprises an anti-node,
   wherein the second spiral member has a vibration mode shape associated with the vibration frequency,
   wherein the vibration mode shape of the second spiral member comprises a node, and
   wherein the first connector surface is attached to the first spiral member at the anti-node and the second connector surface is attached to the second spiral member at the node.

9. The support of claim 6, wherein the damper device further comprises a second damper body comprising a material having vibration dampening properties, and wherein the second damper body has a first connector surface that is connected to the second spiral member.

10. The support of claim 9, wherein the damper device further comprises a constrainer body,
    wherein the first damper body comprises a second connector surface that is connected to the constrainer body, and
    wherein the second damper body comprises a second connector surface that is connected to the constrainer body.

11. The support of claim 6, wherein the material having vibration dampening properties comprises a visco-elastic material.

12. The support of claim 1, wherein the damper device comprises a tuned mass damper that is connected to the first spiral member.

13. The support of claim 12, wherein the tuned mass damper comprises a damper body that has a damper body mass, and wherein the damper body mass is less than 50 grams, less than 20 grams, or between 2 and 15 grams.

14. The support of claim 1, wherein the damper device comprises a ring shaped damper element arranged at an outer circumference of the coil spring that is connected to the first spiral member.

15. A vibration isolation system, comprising:
a support comprising:
  a first end portion and a second end portion, wherein the second end portion is on a side opposite to the first end portion in a longitudinal direction of the support; and
  a coil spring arranged between the first end portion and the second end portion, wherein the coil spring comprises:
    a first spiral member that extends between the first end portion and the second end portion in a circumferential direction of the support;
    a second spiral member that extends between the first end portion and the second end portion in a circumferential direction of the support; and
    the first spiral member and the second spiral member extending in the longitudinal direction around a same longitudinal axis of the support,
    wherein the first spiral member of the coil spring and the second spiral member of the coil spring are moveable relative to each other, and
  wherein the support further comprises a damper device that is attached to the first spiral member.

16. The vibration isolation system of claim 15, further comprising a second support comprising:
  a first end portion and a second end portion, wherein the second end portion is on a side opposite to the first end portion in a longitudinal direction of the support; and
  a coil spring arranged between the first end portion and the second end portion, wherein the coil spring comprises:
    a first spiral member that extends between the first end portion and the second end portion in a circumferential direction of the support; and
    a second spiral member that extends between the first end portion and the second end portion in a circumferential direction of the support,
    wherein the first spiral member and the second spiral member extend in the longitudinal direction around a longitudinal axis of the support,
    wherein the first spiral member of the coil spring and the second spiral member of the coil spring are moveable relative to each other,
  wherein the support further comprises a damper device that is attached to the first spiral member, and
  wherein the first support and the second support are arranged in series with each other or parallel to each other.

17. A lithographic apparatus with a support that comprises:
  a first end portion and a second end portion, wherein the second end portion is on a side opposite to the first end portion in a longitudinal direction of the support; and
  a coil spring arranged between the first end portion and the second end portion, wherein the coil spring comprises:
    a first spiral member that extends between the first end portion and the second end portion in a circumferential direction of the support;
    a second spiral member that extends between the first end portion and the second end portion in a circumferential direction of the support; and
    the first spiral member and the second spiral member extending in the longitudinal direction around a same longitudinal axis of the support,
    wherein the first spiral member of the coil spring and the second spiral member of the coil spring are moveable relative to each other, and
  wherein the support further comprises a damper device that is attached to the first spiral member.

18. A lithographic apparatus comprising:
a first frame;
a second frame; and
a vibration isolation system that is arranged between the first frame and the second frame, wherein the vibration isolation system is the vibration isolation system of claim 15, wherein the first frame is a sensor frame and wherein the second frame is a force frame.

19. An object measurement apparatus comprising the support of claim 1.

20. A device manufacturing method comprising transferring a pattern from a patterning device onto a substrate, comprising the step of using the lithographic apparatus of claim 17.

* * * * *